United States Patent
Kohara

(10) Patent No.: US 11,575,367 B1
(45) Date of Patent: Feb. 7, 2023

(54) FLIP-FLOP CIRCUIT AND ASYNCHRONOUS RECEIVING CIRCUIT

(71) Applicant: KIOXIA CORPORATION, Tokyo (JP)

(72) Inventor: Koji Kohara, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/682,876

(22) Filed: Feb. 28, 2022

(30) Foreign Application Priority Data

Aug. 30, 2021 (JP) .............................. JP2021-140310

(51) Int. Cl.
  *H03K 3/037* (2006.01)
  *H03K 3/356* (2006.01)
  *H03K 3/3562* (2006.01)

(52) U.S. Cl.
  CPC ......... *H03K 3/0372* (2013.01); *H03K 3/0375* (2013.01); *H03K 3/35625* (2013.01); *H03K 3/356104* (2013.01)

(58) Field of Classification Search
  CPC ......... H03K 3/037–0375; H03K 3/356; H03K 3/356104; H03K 3/3562; H03K 3/35625
  See application file for complete search history.

(56) References Cited

U.S. PATENT DOCUMENTS

| | | | |
|---|---|---|---|
| 5,982,211 A * | 11/1999 | Ko | H03K 3/037 327/202 |
| 6,492,854 B1 * | 12/2002 | Ku | H03K 3/037 327/202 |
| 6,794,914 B2 | 9/2004 | Sani et al. | |
| 6,870,412 B2 | 3/2005 | Cho | |

(Continued)

FOREIGN PATENT DOCUMENTS

| | | |
|---|---|---|
| JP | 2008527863 A | 7/2008 |
| JP | 4262053 B2 | 5/2009 |
| JP | 2014087008 A | 5/2014 |

OTHER PUBLICATIONS

Macnica, "[Must-see for RTL design beginners] Impact on the system when an asynchronous signal is input", Feb. 6, 2017, URL: https://www.macnica.co.jp/business/semiconductor/articles/intel/120821/, 12 pages.

(Continued)

*Primary Examiner* — Patrick O Neill
(74) *Attorney, Agent, or Firm* — Kim & Stewart LLP

(57) ABSTRACT

A flip-flop circuit includes first and second latches. The first latch comprises a first inverting logic element and a second inverting logic element. The first inverting logic element has a first logic threshold voltage. The second inverting logic element is connected in antiparallel to the first inverting logic element and has a second logic threshold voltage. The first and second logic threshold voltages are set with respect to one half of a power supply voltage. The second latch comprises a third inverting logic element and a fourth inverting logic element. The third inverting logic element is connected to the first latch and has a third logic threshold voltage. The fourth inverting logic element is connected in antiparallel to the third inverting logic element and has a fourth logic threshold voltage. The third and fourth logic threshold voltages are set with respect to one half of the power supply voltage.

20 Claims, 17 Drawing Sheets

(56) References Cited

U.S. PATENT DOCUMENTS

| | | |
|---|---|---|
| 7,248,090 B2 | 7/2007 | Ramprasad |
| 8,514,000 B1 | 8/2013 | Hsieh et al. |
| 2016/0126939 A1* | 5/2016 | Balasubramanian ........................ H03K 3/0372 327/203 |
| 2020/0195238 A1* | 6/2020 | Semenov ............. H03K 3/0372 |

OTHER PUBLICATIONS

Kiyoshi Takeuchi et al., "Random Fluctuations in Scaled MOS Devices", Conference Paper, Oct. 2009, Simulation of Semiconductor Processes and Devices, 2009, SISPAD '09, pp. 79-85.

* cited by examiner

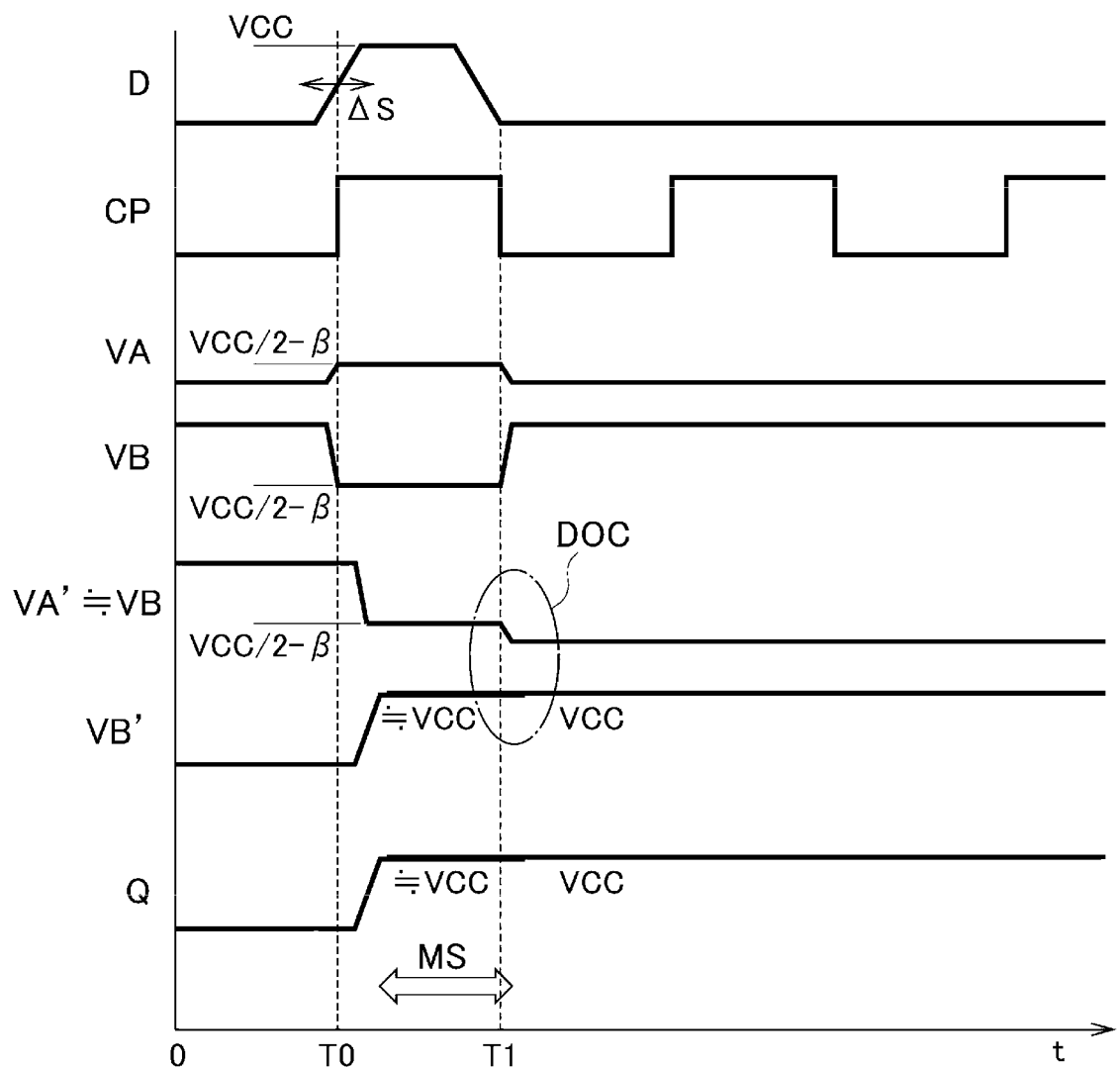

FLIP-FLOP CIRCUIT AND ASYNCHRONOUS RECEIVING CIRCUIT

CROSS-REFERENCE TO RELATED APPLICATION

This application is based upon and claims the benefit of priority from Japanese Patent Application No. 2021-140310, filed Aug. 30, 2021, the entire contents of which are incorporated herein by reference.

FIELD

Embodiments described herein relate generally to a flip-flop circuit and an asynchronous receiving circuit.

BACKGROUND

A synchronous flip-flop (F/F) circuit is used in an asynchronous signal receiving circuit as a measure to address a metastable state. When the metastable time becomes longer, a multi-stage F/F circuit needs to be used, and thus, an F/F with a shorter metastable time is desirable.

If a channel length L and a gate width W of a metal oxide semiconductor field effect transistor (MOSFET) increase, local variations in channel dopant (impurity ion) concentrations are averaged over greater volumes, and it is known that the variation in a MOSFET is generally proportional to $1/\sqrt{(LW)}$.

BRIEF DESCRIPTION OF THE DRAWINGS

FIG. 18 is an operation timing waveform diagram of a flip-flop circuit according to a third embodiment.

DETAILED DESCRIPTION

Figure 1:
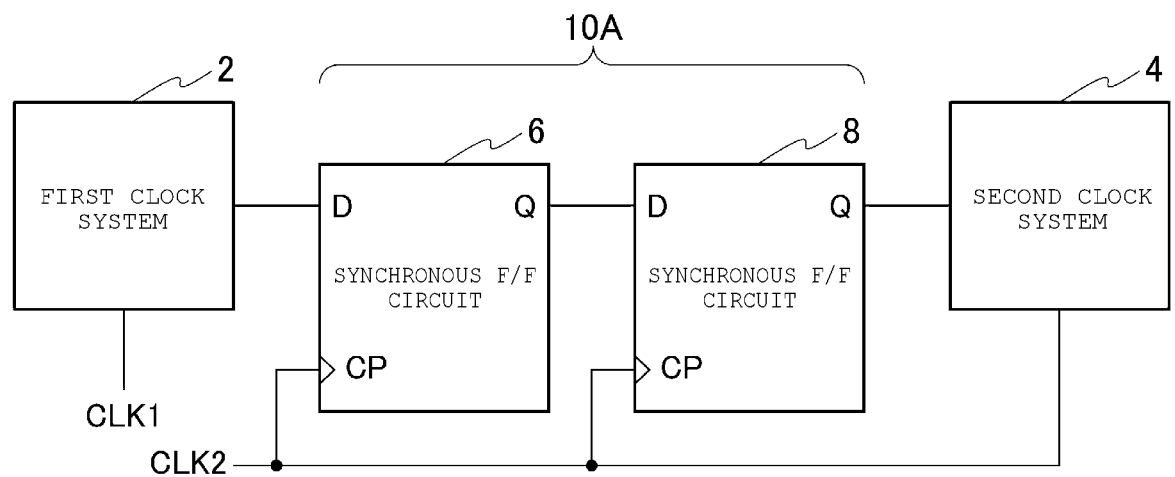
FIG. 1 is a configuration diagram in which an asynchronous receiving circuit is disposed between a first clock system and a second clock system.

Embodiments provide a flip-flop circuit and an asynchronous receiving circuit that are capable of resolving a metastable state in half the time of a clock cycle and achieving a shorter metastable time.

In general, according to one embodiment, a flip-flop circuit includes a first latch and a second latch. The first latch comprises a first inverting logic element and a second inverting logic element. The first inverting logic element has a first logic threshold voltage. The second inverting logic element is connected in antiparallel to the first inverting logic element and has a second logic threshold voltage. The first and second logic threshold voltages are set with respect to one half of a power supply voltage. The second latch comprises a third inverting logic element and a fourth inverting logic element. The third inverting logic element is connected to the first latch and has a third logic threshold voltage. The fourth inverting logic element is connected in antiparallel to the third inverting logic element and has a fourth logic threshold voltage. The third and fourth logic threshold voltages are set with respect to one half of the power supply voltage.

Hereinafter, certain example embodiments will be described with reference to the accompanying drawings. The same, substantially the same, or similar components, elements, parts, and the like of the embodiments depicted in the drawings are denoted by the same reference numerals, and descriptions thereof may be omitted as appropriate after an initial description. The drawings are schematic. The embodiments exemplify circuits, devices, methods, or the like embodying certain technical concepts of the present disclosure. Various modifications may be made to these embodiments and still be within the scope of the disclosure and the claims.

Asynchronous Receiving Circuit

FIG. 1 depicts an asynchronous receiving circuit 10A disposed between a first clock system 2 and a second clock system 4. The asynchronous receiving circuit 10A includes a synchronous F/F circuit 6 and a synchronous F/F circuit 8 connected in series. The first clock system 2 operates in synchronization with a first clock signal CLK1, and the second clock system 4 operates in synchronization with a second clock signal CLK2. The synchronous F/F circuit 6 and the synchronous F/F circuit 8 operate in synchronization with the second clock signal CLK2.

When a frequency of the first clock signal CLK1 is different from a frequency of the second clock signal CLK2, a plurality of synchronous F/F circuits can be provided to synchronize with the second clock signal CLK2. When a metastable time is longer than a cycle of the second clock signal CLK2, a synchronous F/F circuit of three or more stages may be required. For example, the metastable time is standardized by the cycle of the second clock signal CLK2 to determine the number of required stages of the synchronous F/F circuit.

The asynchronous receiving circuit 10A receives the first and second clock signals CLK1 and CLK2 that have different frequencies from each other and receives a signal synchronized with the first clock signal CLK1, which is an asynchronous signal with respect to the second clock signal CLK2. Data is input to the asynchronous receiving circuit 10A in a state where setup and/or hold are violated.

In this context, "metastable" refers to a voltage state for which a value is not fixed. That is, the metastable refers to a voltage state that is between a recognizable high level H and a recognizable low level L. The metastable time is the time until the high level H or the low level L can be determined in a switching operation of the F/F circuit. Generally, the metastable time is lengthened when a driving force (or an amplification rate) of an inverter that configures the F/F circuit is reduced, and is shortened when the driving force (the amplification rate) of the inverter is increased.

Stability of Latch Circuit

Figure 2A:
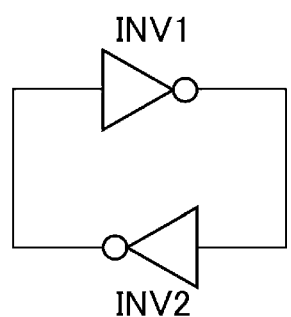
FIG. 2A depicts a latch circuit including inverters.
Figure 2B:
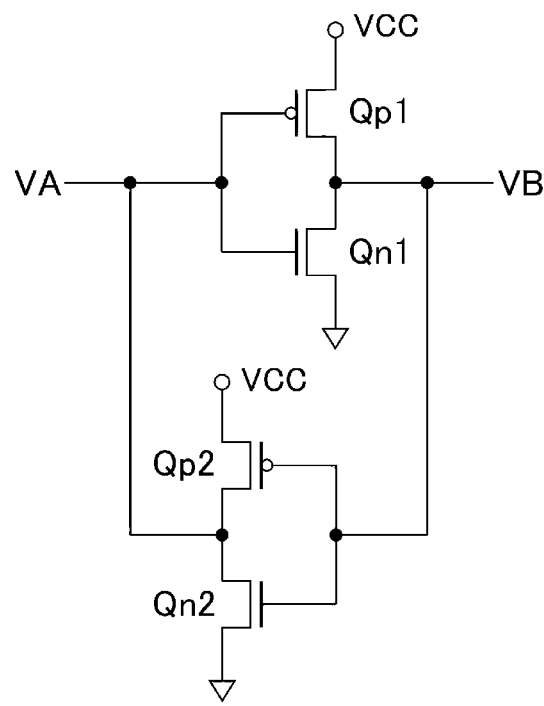
FIG. 2B depicts a latch circuit configured with a CMOS inverter.

FIG. 2A is a configuration diagram of a latch circuit including an inverter INV1 and an inverter INV2 connected in antiparallel to the inverter INV1. FIG. 2B is a configuration diagram of a latch circuit configured with a complementary metal-oxide-semiconductor (CMOS) inverter. As illustrated in FIG. 2B, the inverter INV1 is configured with a CMOS inverter including a PMOSFET Qp1 and an NMOSFET Qn1, and the inverter INV2 is configured with a CMOS inverter including a PMOSFET Qp2 and an NMOSFET Qn2. An input voltage VA of the inverter INV1 is equal to an output voltage of the inverter INV2, and an output voltage VB of the inverter INV1 is equal to an input voltage of the inverter INV2. A power supply voltage is represented by VCC.

Figure 3:
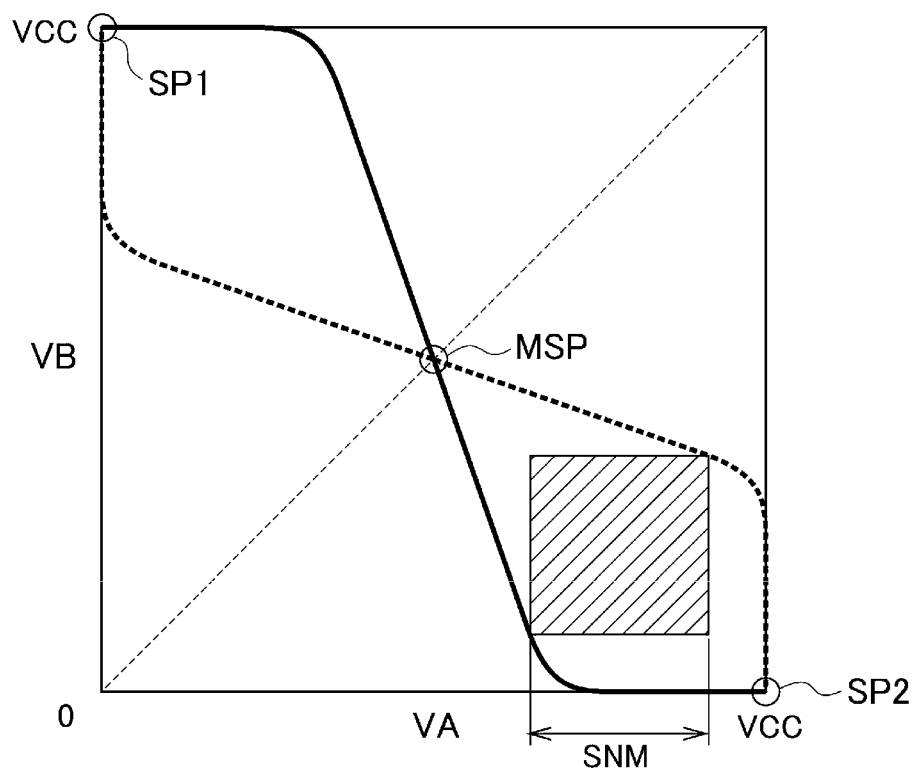
FIG. 3 depicts aspects related to stability (operation margin) and load characteristics of a latch circuit configured with a CMOS inverter.

FIG. 3 is an explanatory diagram related to stability (operation margin) and load characteristics of the latch circuit of FIG. 2B. In FIG. 3, input/output characteristics of the inverter INV1 are represented by a solid line, and input/output characteristics of the inverter INV2 are represented by a dashed line.

As illustrated in FIG. 3, the flip-flop circuit is stable at (VA, VB)=(H, L) or (L, H) but may be stable even at other voltage states. This stability point is unstable and is called a metastable point (or a metastability point) MSP. A metastable voltage is a voltage at which the flip-flop circuit takes the metastable point MSP. The metastable point MSP is determined by a cross-point of two inverter characteristics. In the latch circuit of FIG. 2B, the metastable point MSP is close to VA=VCC/2 and VB=VCC/2. Both the PMOSFET Qp1 and the NMOSFET Qn1 and both the PMOSFET Qp2 and the NMOSFET Qn2 are in an ON state. In FIG. 3, a stable point SP1 is at VA=0 and VB=VCC, and a stable point SP2 is at VA=VCC and VB=0. These points are called stability points. Further, in FIG. 3, a range represented by a square is a static noise margin (SNM). The SNM is determined by the largest square inscribed in the two inverter characteristics. The voltage VA and the voltage VB are in a range of zero and the power supply voltage VCC.

Logic Threshold Voltage

Figure 4A:
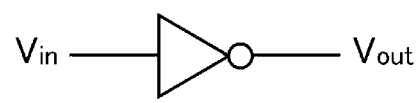
FIG. 4A is a circuit representation of an inverter.
Figure 4B:
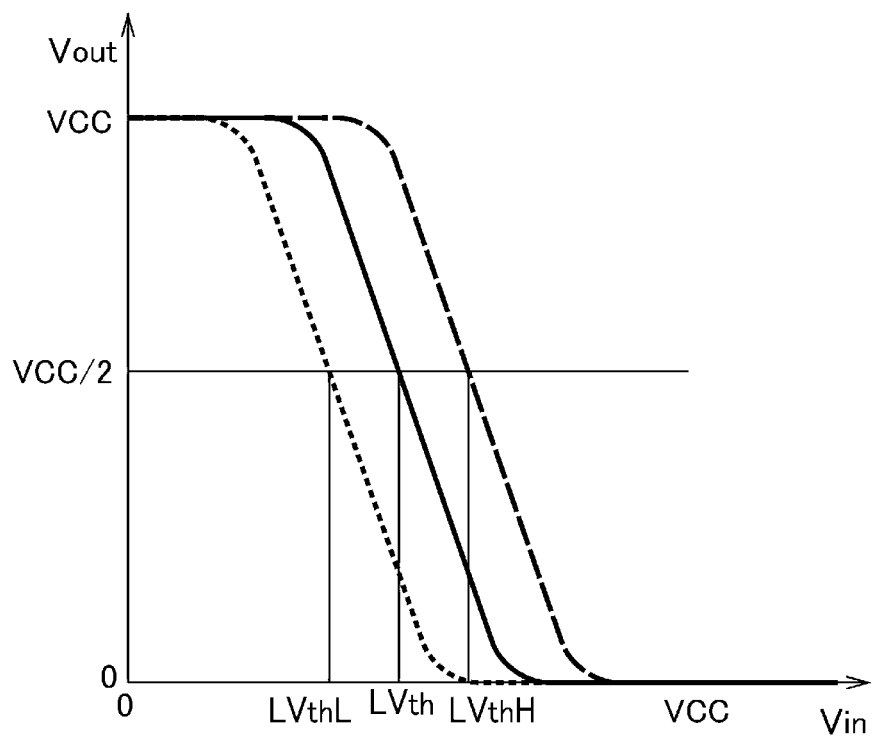
FIG. 4B is an explanatory diagram of a logic threshold voltage of an inverter.

FIG. 4A is a circuit representation of an inverter with an input voltage Vin and an output voltage Vout. FIG. 4B illustrates input/output transfer characteristics of the inverter of FIG. 4A. The inverter is configured with a CMOS that has a power supply voltage of VCC.

When a driving force of the NMOS is equal to a driving force of the PMOS, a logic threshold voltage Vth (inv) of the inverter is VCC/2. As illustrated in FIG. 4B, the logic threshold voltage Vth (inv) of the inverter is represented by LVth.

When the driving force of the NMOS is greater than the driving force of the PMOS, the logic threshold voltage Vth (inv) of the inverter is less than VCC/2 (that is, the logic threshold voltage is low). As illustrated in FIG. 4B, this logic threshold voltage Vth (inv) of the inverter is represented by LVthL. An inverter with a low logic threshold voltage is defined as an inverter with a logic threshold voltage less than or equal to VCC/2.

When the driving force of the NMOS is less than the driving force of the PMOS, the logic threshold voltage Vth (inv) of the inverter is greater than VCC/2 (that is, the logic threshold voltage is high). As illustrated in FIG. 4B, this logic threshold voltage Vth (inv) of the inverter is represented by LVthH. An inverter with a high logic threshold voltage is defined as an inverter with a logic threshold voltage exceeding VCC/2.

Assuming that a gate-source voltage of a MOS transistor is Vgs and a threshold voltage is Vth, a drain-source current Ids is represented by $Ids=\beta (Vgs-Vth)^2/2$. Therefore, a driving force of the MOS transistor increases as the threshold voltage Vth is reduced. Further, it is also represented by $\beta=(W/L)\times \mu Cox$. In order to increase $\beta$, a channel width W may be increased, a channel length L may be reduced, mobility $\mu$ may be increased, a gate oxide film thickness may be reduced, and a gate capacitance Cox per unit area may be increased.

In order to set the logic threshold voltage to be low, the threshold voltage of the NMOS may be set low, the channel width of the NMOS may be increased, the channel length of the NMOS may be reduced, the mobility of electron mobility $\mu_n$ may be increased, and the gate oxide film thickness of the NMOS may be reduced. The threshold voltage of the PMOS may be set high, the channel width of the PMOS may be reduced, the channel length of the PMOS may be increased, the mobility or hole mobility $\mu_p$ may be reduced, and the gate oxide film thickness of the PMOS may be increased.

In order to set the logic threshold voltage to be high, the threshold voltage of the NMOS may be set high, the channel width of the NMOS may be reduced, the channel length of the NMOS may be increased, the electron mobility $\mu_n$ may be reduced, and the gate oxide film thickness of the NMOS may be increased. The threshold voltage of a PMOS may be set low, the channel width of the PMOS may be increased, the channel length of the PMOS may be reduced, the hole mobility $\mu_p$ may be increased, and the gate oxide film thickness of the PMOS may be reduced.

Comparison Example

Figure 5:
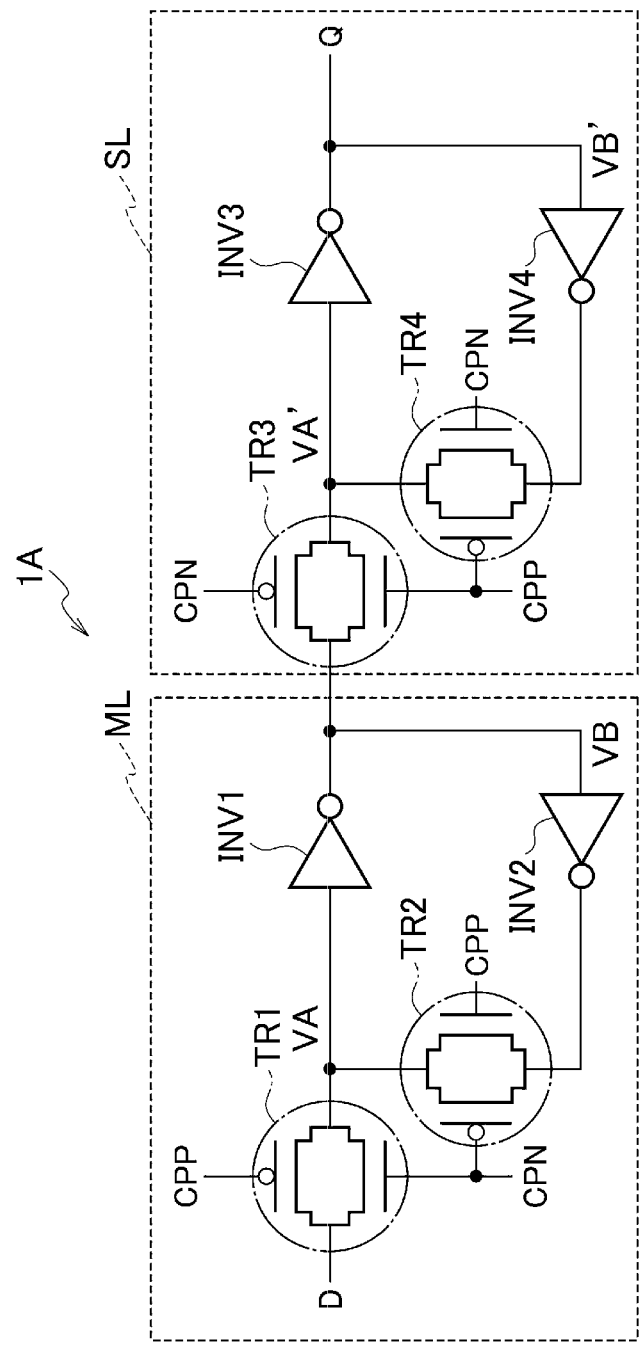
FIG. 5 depicts a flip-flop circuit according to a comparative example.

FIG. 5 is a configuration example of a flip-flop circuit 1A according to a comparative example. The flip-flop circuit 1A according to the comparative example includes a master latch ML and a slave latch SL. The master latch ML includes an inverter INV1 that has a logic threshold voltage equal to one half of the power supply voltage VCC, and an inverter INV2 that is connected in antiparallel to the inverter INV1 and that has a logic threshold voltage equal to one half of the power supply voltage VCC. The slave latch SL includes an inverter INV3 that is connected to the master latch ML and that has a logic threshold voltage equal to one half of the power supply voltage VCC, and an inverter INV4 that is connected in antiparallel to the inverter INV3 and that has a logic threshold voltage equal to one half of the power supply voltage VCC.

The flip-flop circuit 1A according to the comparative example also includes a first transfer gate circuit TR1 connected between an input D of the flip-flop circuit 1A and an input of the inverter INV1, a second transfer gate circuit TR2 connected between an output of the inverter INV2 and the input of the inverter INV1, a third transfer gate circuit TR3 connected between an output of the master latch ML and an input of the inverter INV3, and a fourth transfer gate circuit TR4 connected between an output of the inverter INV4 and an input of the inverter INV3. Further, the first, second, third, and fourth transfer gate circuits each include a parallel circuit of an n-channel MOS transistor and a p-channel MOS transistor. Further, the first, second, third, and fourth inverters each include a CMOS inverter.

Figure 6A:
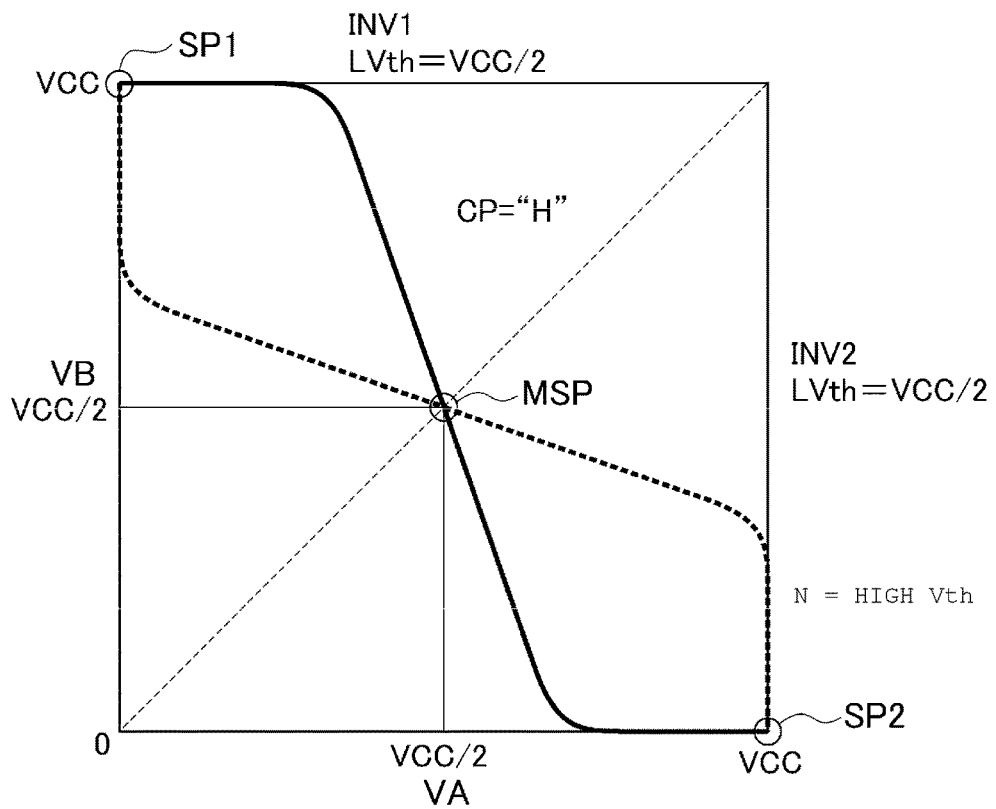
FIG. 6A depicts load characteristics of a master latch of a flip-flop circuit according to a comparative example.
Figure 6B:
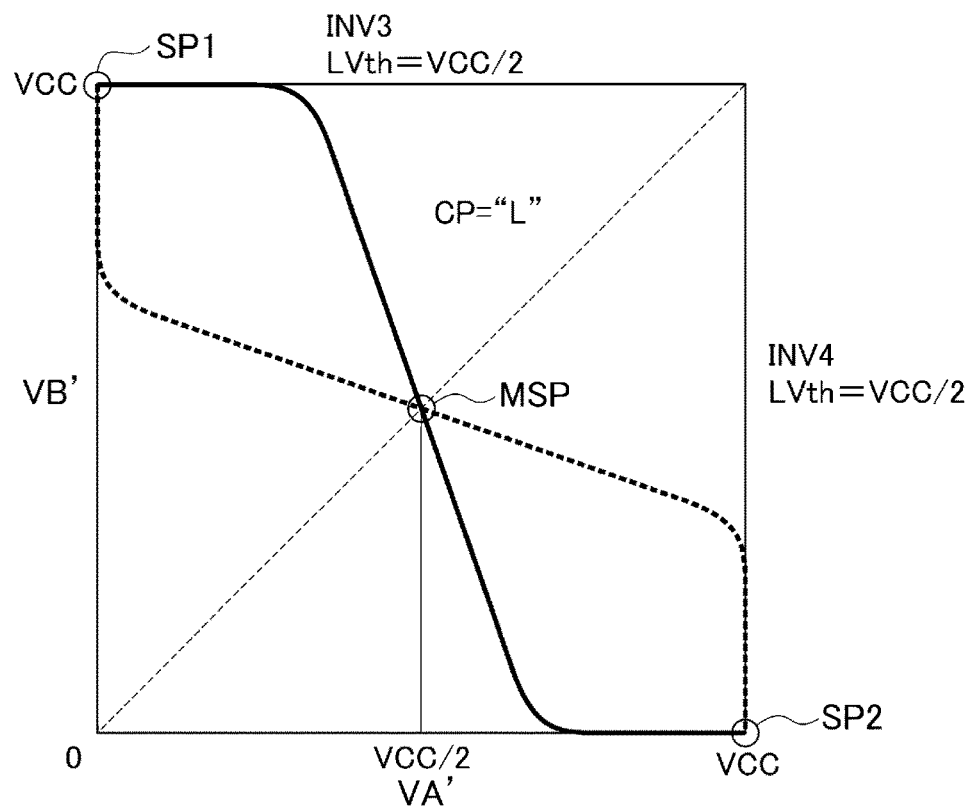
FIG. 6B depicts load characteristics of a slave latch of a flip-flop circuit according to a comparative example.

FIG. 6A depicts load characteristics of the master latch ML of FIG. 5, and FIG. 6B depicts load characteristics of the slave latch SL of FIG. 5.

In the flip-flop circuit 1A according to the comparative example, metastable points MSP of the master latch ML and the slave latch SL are at VA=VCC/2 and VB=VCC/2, respectively, and metastable voltages VCC/2 are equal to each other. In the flip-flop circuit 1A according to the comparative example, clocks CPP and CPN are generated by a clock generation circuit 3 illustrated in FIG. 9C. For example, when a clock CP is in a high level H, CPN goes to a low level and CPP goes to a high level.

In the flip-flop circuit 1A according to the comparative example, when data input D stops transfer near the metastable voltage VCC/2, an operating point of the master latch ML becomes the metastable point MSP at CP=H, and the master latch ML enters its metastable state. Further, an operating point of the slave latch SL becomes the metastable point MSP at CP=L, and the slave latch SL enters its metastable state.

Figure 7:
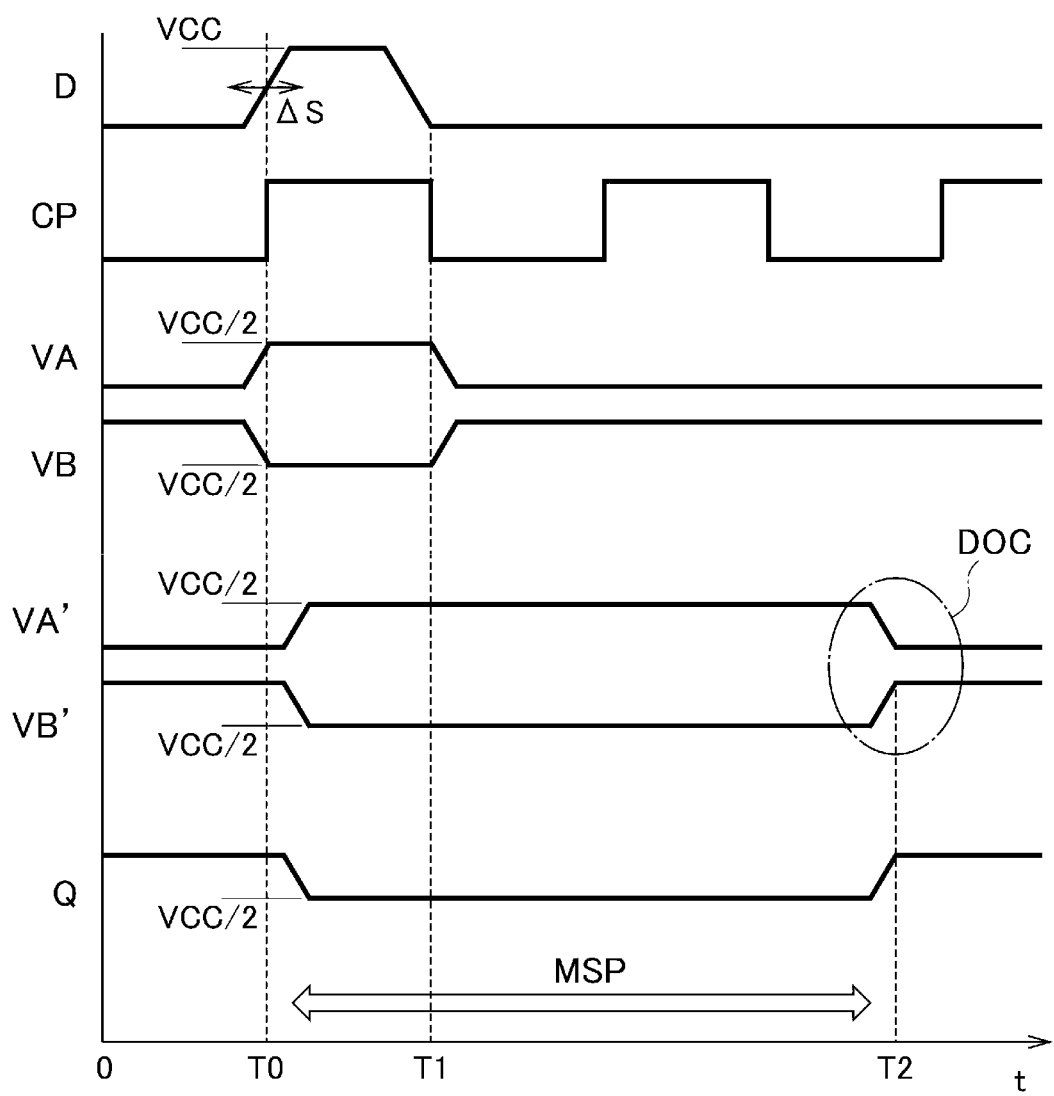
FIG. 7 is an operation timing waveform diagram of a flip-flop circuit according to a comparative example.

FIG. 7 is an operation timing waveform diagram of the flip-flop circuit 1A according to the comparative example.

At time t=T0, as indicated by ΔS, when the data input D changes asynchronously to the clock CP, a setup violation state is generated, and transfer is stopped near the metastable voltage VCC/2. The clock CP goes to the high level H at time t=T0, and when an operation in which the clock CP goes to a low level at time t=T1 is performed, the master latch ML has the voltage VA of internal node increasing from a zero level to VCC/2 and the voltage VB of internal node decreasing from VCC to VCC/2 during the period from time T0 to time T1.

In the slave latch SL, after a slight delay from time T0, a voltage VA' of internal node increases from the zero level to VCC/2, and a voltage VB' of internal node decreases from VCC to VCC/2.

A data output Q of the flip-flop circuit 1A according to the comparative example shifts from VCC to VCC/2 and continuously stores the value until entering an output data determination state DOC at time T2. That is, during the period from time T0 to time T2, the metastable state continues in a range indicated by an arrow MSP.

In the flip-flop circuit 1A according to the comparative example, the metastable state continues longer than a clock cycle. For example, in FIG. 7, the metastable state continues for about two clock cycles. Accordingly, it is necessary to increase a response time (or latency) until an asynchronous signal can be synchronized.

First Embodiment

Figure 8:
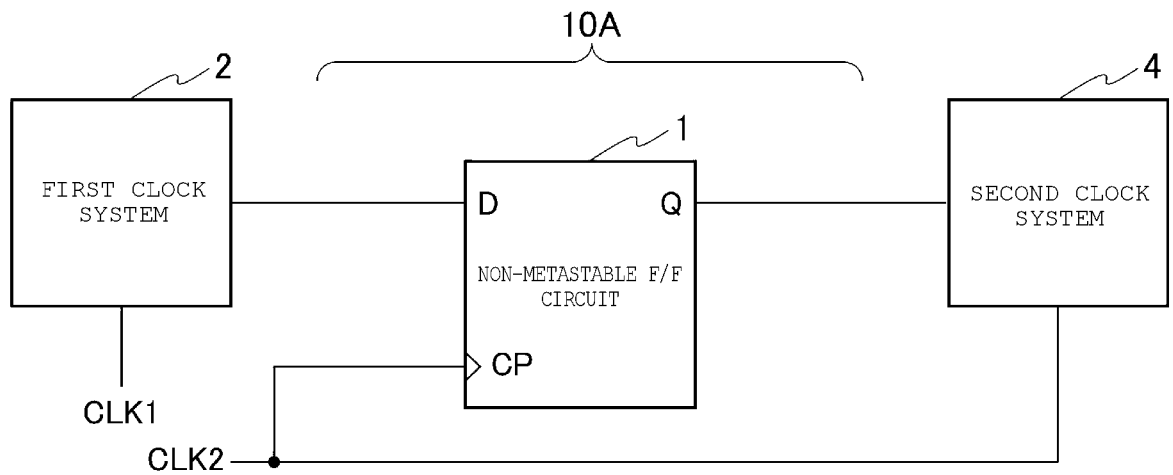
FIG. 8 is a diagram illustrating a configuration example of a semiconductor circuit according to a first embodiment.
Figure 9A:
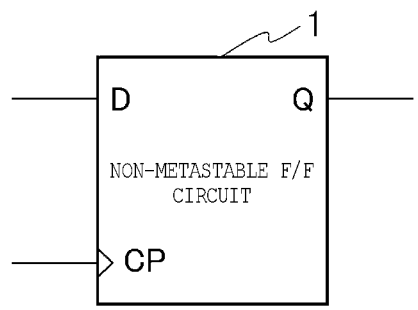
FIG. 9A depicts a symbol representation of a flip-flop circuit according to a first embodiment.
Figure 9B:
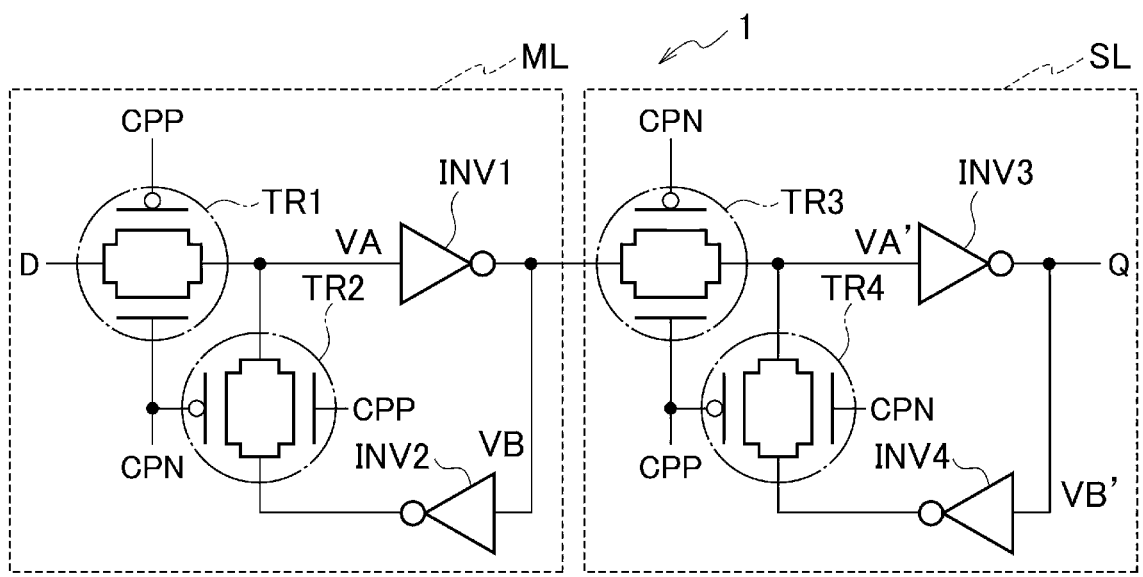
FIG. 9B depicts a configuration example of a flip-flop circuit according to a first embodiment.

FIG. 8 is a diagram illustrating a configuration of a semiconductor circuit according to a first embodiment. In the first embodiment, a non-metastable F/F circuit 1 is used instead of the asynchronous receiving circuit 10A in FIG. 1. FIG. 9A is a symbol representation of the flip-flop circuit 1 which is the non-metastable F/F circuit according to the first embodiment. FIG. 9B is a configuration example of the flip-flop circuit 1 according to the first embodiment. The master latch ML of the flip-flop circuit 1 according to the first embodiment includes an inverter INV1 that has a logic threshold voltage less than or equal to one half of the power supply voltage VCC and an inverter INV2 that is connected in antiparallel to inverter INV1 and that has a logic threshold voltage exceeding one half of the power supply voltage VCC. The slave latch SL of the flip-flop circuit 1 according to the first embodiment includes an inverter INV3 that is connected to the master latch ML and that has a logic threshold voltage less than or equal to one half of the power supply voltage VCC and an inverter INV4 that is connected in antiparallel to the inverter INV3 and that has a logic threshold voltage exceeding one half of the power supply voltage VCC.

In the flip-flop circuit 1 according to the first embodiment, the inverter INV1 has a low logic threshold voltage, the inverter INV2 has a high logic threshold voltage, the inverter INV3 has a low logic threshold voltage, and the inverter INV4 has a high logic threshold voltage. In order to implement these logic threshold voltages to the respective inverters in the flip-flop circuit 1 according to the first embodiment, threshold voltages of MOS transistors which configure the inverters INV, INV2, INV3, and INV4 may be set such that PMOS transistors and NMOS transistors which configure the inverters INV1 and INV3 are set to have, respectively, high threshold voltages and low threshold voltages and PMOS transistors and NMOS transistors which configure the inverters INV2 and INV4 are set to have, respectively, low threshold voltages and high threshold voltages.

The flip-flop circuit 1 according to the first embodiment also includes a transfer gate circuit TR1 connected between an input D of the flip-flop circuit 1 and an input of the inverter INV1, a transfer gate circuit TR2 connected between an output of the inverter INV2 and the input of the inverter INV1, a transfer gate circuit TR3 connected between an output of the master latch ML and an input of the inverter INV3, and a transfer gate circuit TR4 connected between an output of the inverter INV4 and an input of the inverter INV3.

The transfer gate circuits TR1, TR2, TR3, and TR4 each include a parallel circuit of an n-channel MOS transistor and a p-channel MOS transistor.

The inverters INV1, INV1, INV2, and INV4 each include a CMOS inverter.

The logic threshold voltages of the inverters INV1, INV2, INV3, and INV4 can be adjusted by the threshold voltages of the MOS transistors that configure the inverters INV1, INV2, INV3, and INV4.

The threshold voltages of the MOS transistors that configure the inverters INV1, INV2, INV3, and INV4 can be adjusted by channel impurity concentrations or oxide film thicknesses of the MOS transistors.

The inverters INV1, INV2, INV3, and INV4 may use transistors that have a less variation than variations in the threshold voltages of the transistors that configure the transfer gate circuits TR1, TR2, TR3, AND TR4.

Figure 9C:
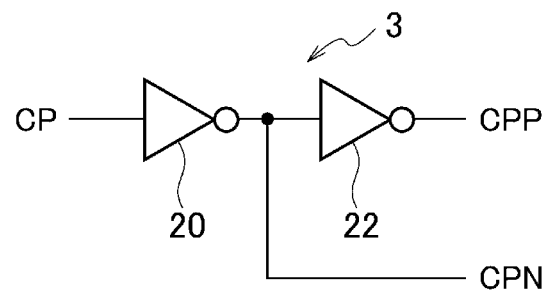
FIG. 9C depicts a configuration example of a clock generation circuit according to a first embodiment.

FIG. 9C is a configuration example of the clock generation circuit 3 according to the first embodiment. The clock generation circuit 3 includes an inverter 20 and another inverter 22 connected in series to the inverter 20. A clock CPN obtained by inverting the clock CP is generated. Furthermore, a clock CPP obtained by inverting the clock CPN is generated.

As illustrated in FIG. 9A, the clock CP is input to a CP terminal of the flip-flop circuit 1 according to the first embodiment, and a data output Q is output from the Q terminal with respect to the data input D input to the D terminal.

The clocks CPN and CPP are input to gates of the transfer gate circuits TR1, TR2, TR3, and TR4 as illustrated in FIG. 9B.

Figure 10A:
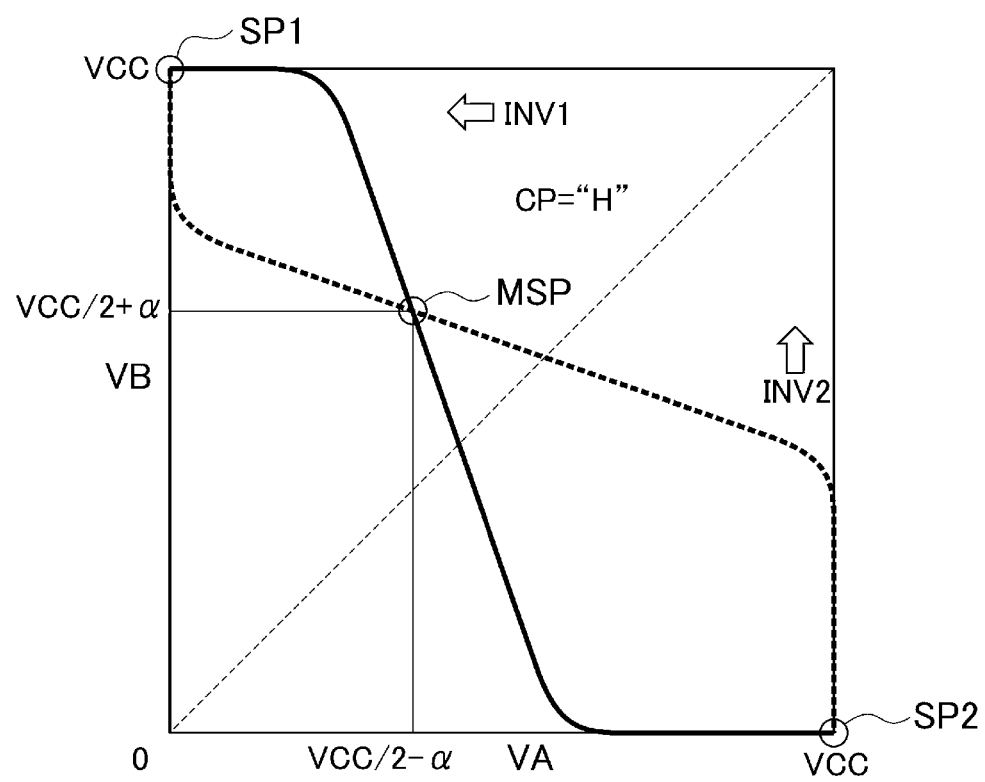
FIG. 10A depicts load characteristics of a master latch of a flip-flop circuit according to a first embodiment.
Figure 10B:
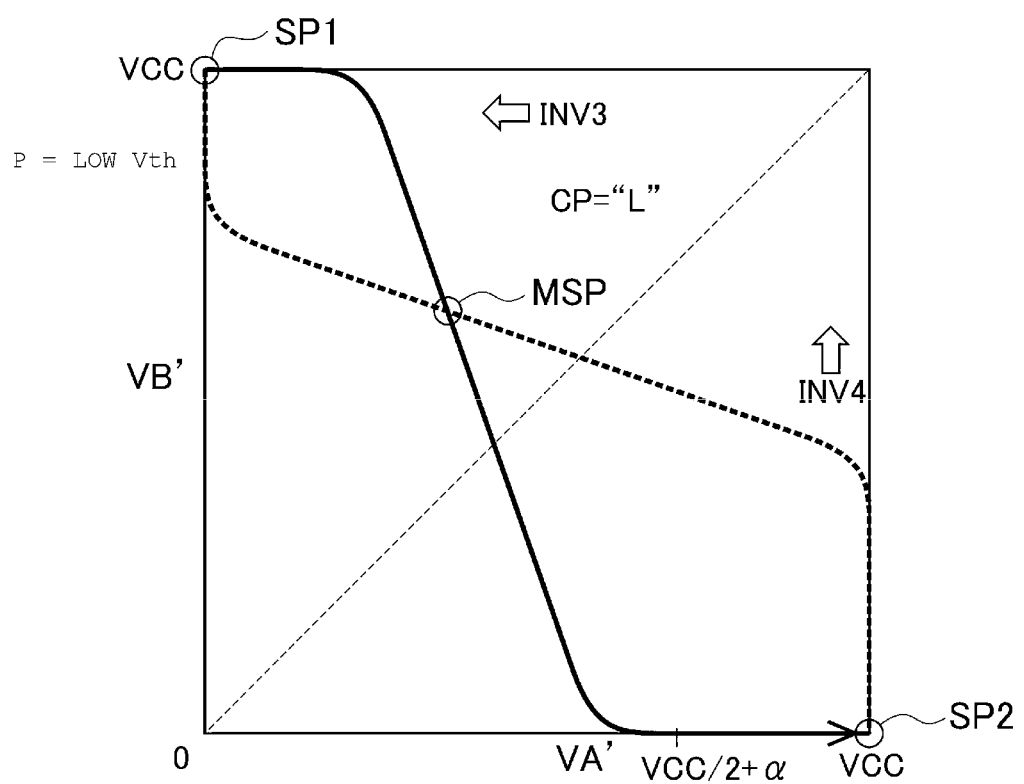
FIG. 10B depicts load characteristics of a slave latch of a flip-flop circuit according to a first embodiment.

FIG. 10A depicts load characteristics of the master latch ML of FIG. 9B, and FIG. 10B depicts load characteristics of the slave latch SL of FIG. 9B.

In the flip-flop circuit 1 according to the first embodiment, the metastable point MSP of the master latch ML is shifted from VA=VCC/2 and VB=VCC/2 to VA=VCC/2−α and VB=VCC/2+α, where α is a voltage in a range of 0<α<VCC/2.

In the flip-flop circuit 1 according to the first embodiment, when the data input D stops transfer near the metastable voltage VCC/2−α, an operating point of the master latch ML becomes the metastable point MSP at CP=H as illustrated in FIG. 10A, and the master latch ML enters its metastable state. At that time, the logic threshold voltage of the inverter INV1 is low, and the logic threshold voltage of the inverter INV2 is high. Further, as illustrated in FIG. 10B, an operating point of the slave latch SL becomes the metastable point MSP at CP=L, and the slave latch SL enters its metastable state. At that time, the logic threshold voltage of the inverter INV3 is low, and the logic threshold voltage of the inverter INV4 is high.

The master latch ML stores data during a period of clock CP=H, and the slave latch SL stores data during a period of clock CP=L. When the slave latch SL stores data at CP=L, the slave latch SL is not metastable, and thus, the operating point thereof immediately moves to the stability point SP2. During the period of CP=L, VA'=VCC/2+a is input, and characteristics of the slave latch SL makes VB'≈0 V. Since CP=L and the slave latch SL stores data, VA'=VCC and VB'=0 V are determined at that time.

Operation Timing Waveform

Figure 11A:
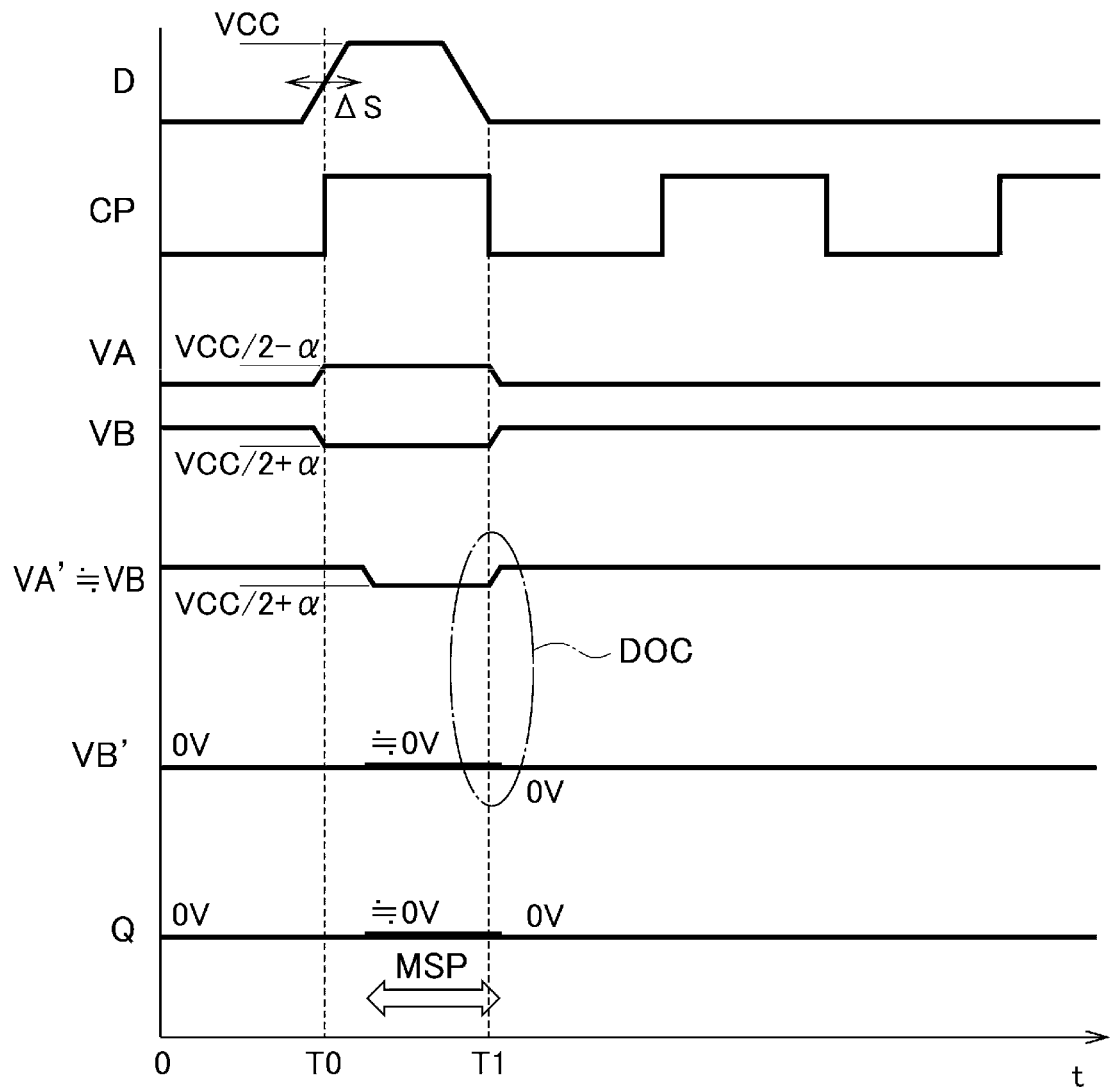
FIG. 11A is an operation timing waveform diagram of a flip-flop circuit according to a first embodiment.

FIG. 11A is an operation timing waveform diagram of the flip-flop circuit 1 according to the first embodiment. At time t=T0, as indicated by ΔS, when the data input D changes asynchronously to the clock CP, a setup violation state is generated and transfer is stopped near the metastable voltage VCC/2−α. When an operation is performed in which the clock CP goes to a high level H at time t=T0 and the clock CP goes to a low level at time t=T1, the master latch ML has a voltage VA of internal node increasing from a zero level to VCC/2−α and a voltage VB of internal node decreasing from VCC to VCC/2+α during the period from time T0 to time T1.

In the slave latch SL, after a slight delay from time T0, a voltage VA' of internal node is approximately equal to the voltage VB of internal node, and thus, the voltage VA' decreases from VCC to VCC/2+α, the voltage VB' of internal node increases to a level approximately equal to a zero level, and a data output Q increases to a level approximately equal to the zero level.

Furthermore, at time t=T1 and at a point represented by DOC, the voltage VA of internal node decreases from VCC/2−α to the zero level, the voltage VB of internal node increases from VCC/2+α to VCC, and the master latch ML stores values thereof. That is, the master latch ML enters an output data determination state.

Since the slave latch SL has the voltage of internal node which is VA'≈VB at time t=T1, the slave latch SL increases from VCC/2+α to VCC. The voltage VB' of internal node decreases to the zero level and holds the value thereof. The data output Q is reduced to the zero level and holds the value thereof.

Figure 11B:
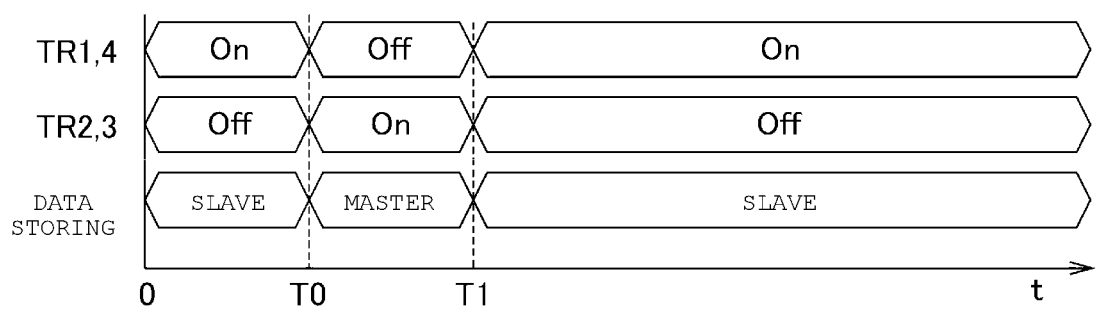
FIG. 11B is an explanatory diagram of a relationship between on/off operation timings of transfer gate circuits and data storing characteristics according to a first embodiment.

FIG. 11B is an explanatory diagram of a relationship between on/off operation timings of the transfer gate circuits TR1 and TR4 and the transfer gate circuits TR2 and TR3 and data storing characteristics according to the first embodiment.

Figure 12:
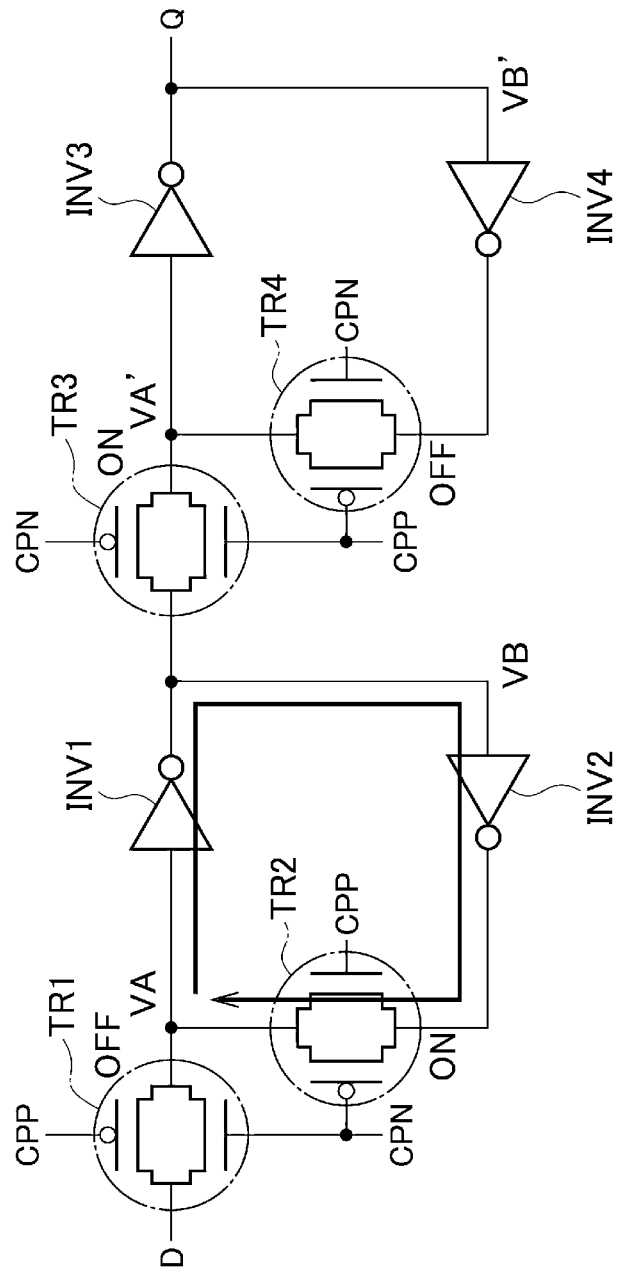
FIG. 12 is an operation explanatory diagram when a clock CP is at a high level according to a first embodiment.

FIG. 12 is an operation explanatory diagram when the clock CP is in a high level H in the flip-flop circuit 1 according to the first embodiment. When the clock CP is in the high level H, the transfer gate circuits TR1 and TR4 enter an off state, and the transfer gate circuits TR2 and TR3 enter an on state. A current flows through a closed circuit composed of the inverters INV1 and INV2 and the transfer gate circuit TR2 in the master latch ML. A current of a closed circuit composed of the inverters INV3 and INV4 and the transfer gate circuit TR4 in the slave latch SL is cut off.

Figure 13:
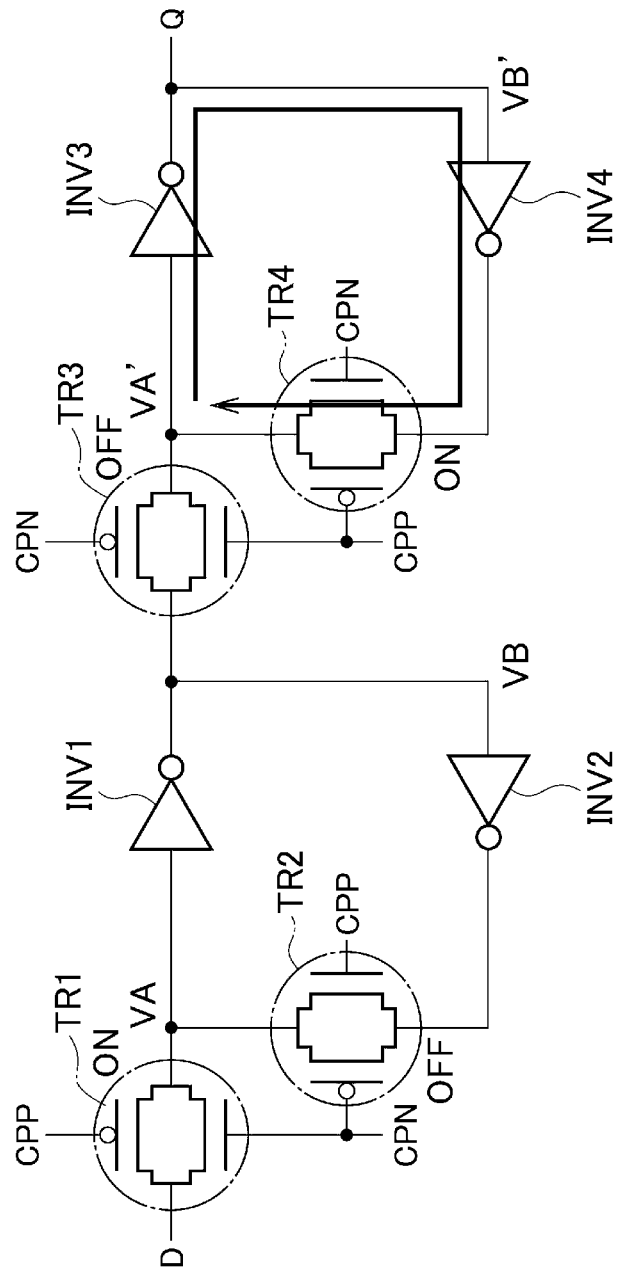
FIG. 13 is an operation explanatory diagram when the clock CP is at a low level according to a first embodiment.

FIG. 13 is an operation explanatory diagram when the clock CP is in a low level L in the flip-flop circuit 1 according to the first embodiment. When the clock CP is in the low level L, the transfer gate circuits TR1 and TR4 enter an on state, and the transfer gate circuits TR2 and TR3 enter an off state. A current flows through a closed circuit composed of the inverters INV3 and INV4 and the transfer gate circuit TR4 in the slave latch SL. A current of a closed circuit composed of the inverters INV1 and INV2 and the transfer gate circuit TR2 in the master latch ML is cut off.

During the period from time t=0 to T0, the clock CP is in the low level L, the transfer gate circuits TR1 and TR4 enter an on state, and the transfer gate circuits TR2 and TR3 enter an off state. During this period, data is stored in the slave latch SL.

During the period from time t=T0 to time T1, the clock CP is in the high level H, the transfer gate circuits TR1 and TR4 enter an off state, and the transfer gate circuits TR2 and TR3 enter an on state. During this period, data is stored in the master latch ML.

During the period after time t=T1, the clock CP is in the low level L, the transfer gate circuits TR1 and TR4 enter an on state, and the transfer gate circuits TR2 and TR3 enter an off state. During this period, data is stored in the slave latch SL.

The metastable point MSP can be shifted by changing the logic threshold voltages of the two inverters. If a driving force of an NMOS transistor is greater than that of a PMOS transistor, the logic threshold voltage is reduced. If a driving force of a PMOS transistor is greater than that of a NMOS transistor, the logic threshold voltage is increased. The metastable voltage can be shifted by configuring a latch with an inverter of a low logic threshold voltage and an inverter of a high logic threshold voltage. Changing a driving force by changing a threshold voltage of each transistor is one method of shifting the logic threshold voltage.

By intentionally shifting the metastable voltages of the master latch ML and the slave latch SL, an F/F in which data is determined in a half cycle in principle can be configured. By configuring the latch circuit with inverters that have different logic threshold voltages from one another, the metastable voltages of the master latch ML and the slave latch SL can be intentionally shifted.

In the flip-flop circuit (or the non-metastable F/F circuit) 1 according to the first embodiment, as illustrated by the arrow MSP in FIG. 11A, the high level H or the low level L of data is determined after a half cycle of the clock CP. Determination is made when the clock falls after a half cycle. When viewed over the course of one cycle, a metastable state is resolved. That is, the metastable state ends after the half cycle.

Effects of First Embodiment

According to the first embodiment, a metastable state can be resolved in one-half the time of a clock cycle (half cycle), and thus the response time (latency) until an asynchronous signal is synchronized can be reduced.

Second Embodiment: Asynchronous Receiving Circuit

Figure 14:
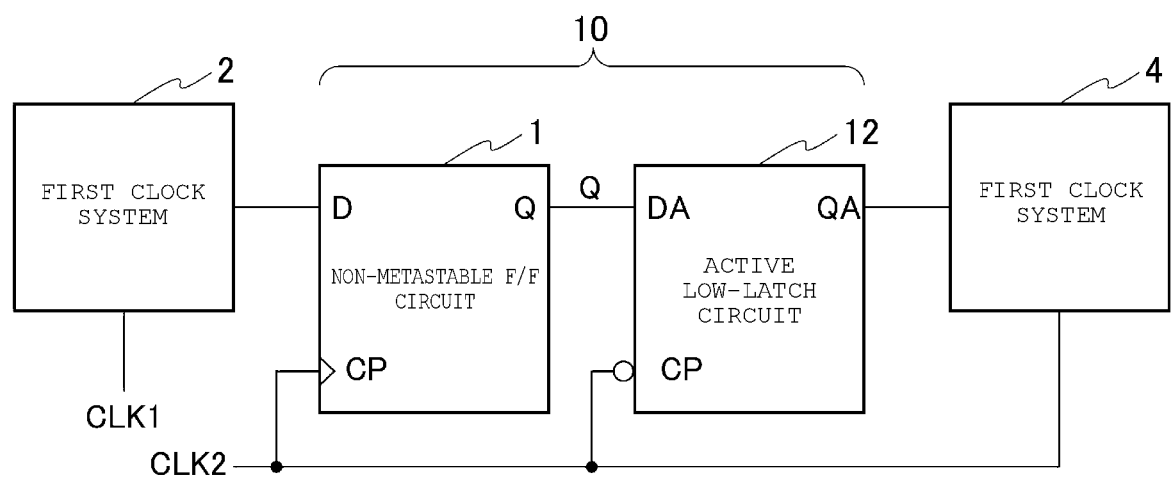
FIG. 14 is a configuration diagram of an asynchronous receiving circuit according to a second embodiment.

FIG. 14 is a configuration diagram in which an asynchronous receiving circuit 10 according to a second embodiment is arranged between the first clock system 2 and the second clock system 4. The asynchronous receiving circuit 10 includes the flip-flop circuit (non-metastable F/F circuit) 1 according to the first embodiment and an active low-latch circuit 12 connected in series to the non-metastable F/F circuit 1. The first clock system 2 operates in synchronization with a first clock signal CLK1, and the second clock system 4 operates in synchronization with a second clock signal CLK2. The non-metastable F/F circuit 1 and the active low-latch circuit 12 operate in synchronization with the second clock signal CLK2.

Active Low-Latch Circuit

Figure 15:
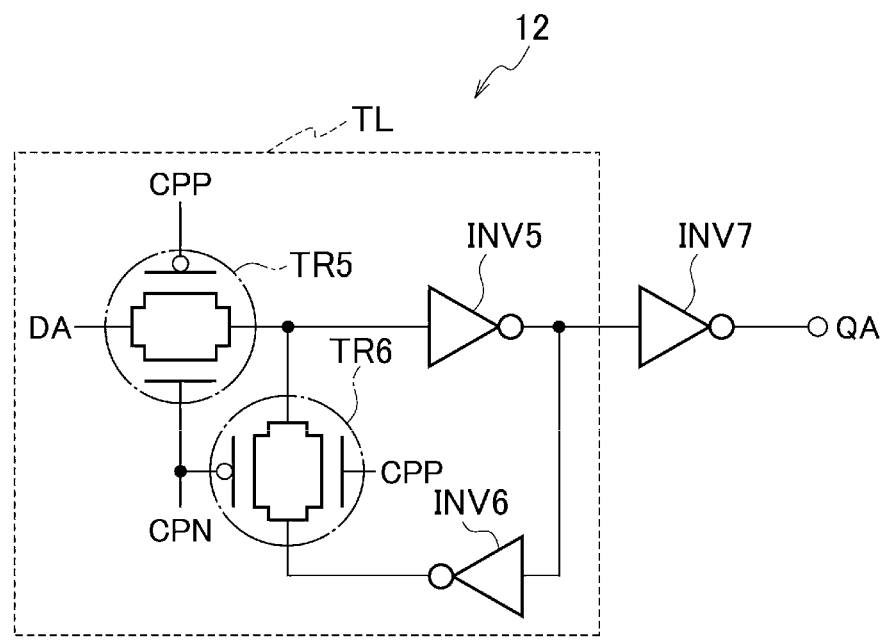
FIG. 15 is a configuration diagram of an active low-latch circuit according to a second embodiment.

FIG. 15 is a configuration diagram of the active low-latch circuit 12 applied to FIG. 14. The active low-latch circuit 12 includes a third latch TL including an inverter INV5 and an inverter INV6 connected in antiparallel to the inverter INV5, and an inverter INV7 connected to an output of the third latch TL.

The active low-latch circuit 12 further includes a transfer gate circuit TR5 connected between a data input DA of the active low-latch circuit 12 and an input of the inverter INV5, and a transfer gate circuit TR6 connected between an output of the inverter INV6 and the input of the inverter INV5.

The transfer gate circuits TR5 and TR6 each include a parallel circuit of an n-channel MOS transistor and a p-channel MOS transistor.

The inverters INV5, INV6, and INV7 each include a CMOS inverter.

Logic threshold voltages of the inverters INV5, INV6, and INV7 can be adjusted by threshold voltages of the MOS transistors that configure the inverter INV5, INV6, and INV7.

Further, the threshold voltages of the MOS transistors that configure the inverters INV5, INV6, and INV7 can be adjusted by channel impurity concentrations or oxide film thicknesses of the MOS transistors.

The inverters INV5, INV6, and INV7 include transistors that have a less variation than variations in threshold voltages of transistors that configure the transfer gate circuits TR5 and TR6.

Also, in the active low-latch circuit 12, clocks CPP and CPN are generated by the clock generation circuit 3 illustrated in FIG. 9C.

As illustrated in FIG. 14, the clock CP is input to a CP terminal of the non-metastable F/F circuit 1, and a data output Q is output from a Q terminal thereof with respect to a data input D input to a D terminal. Further, as illustrated in FIG. 14, the clock CP is input to a CP terminal of the active low-latch circuit 12, and a data output QA is output from a QA terminal thereof with respect to a data input DA input to a DA terminal. The data output Q of the non-metastable F/F circuit 1 is the same as the data input DA of the active low-latch circuit 12.

The clocks CPN and CPP are input to gates of the transfer gate circuits TR5 and TR6 as illustrated in FIG. 15.

Operation Timing Waveform

Figure 16A:
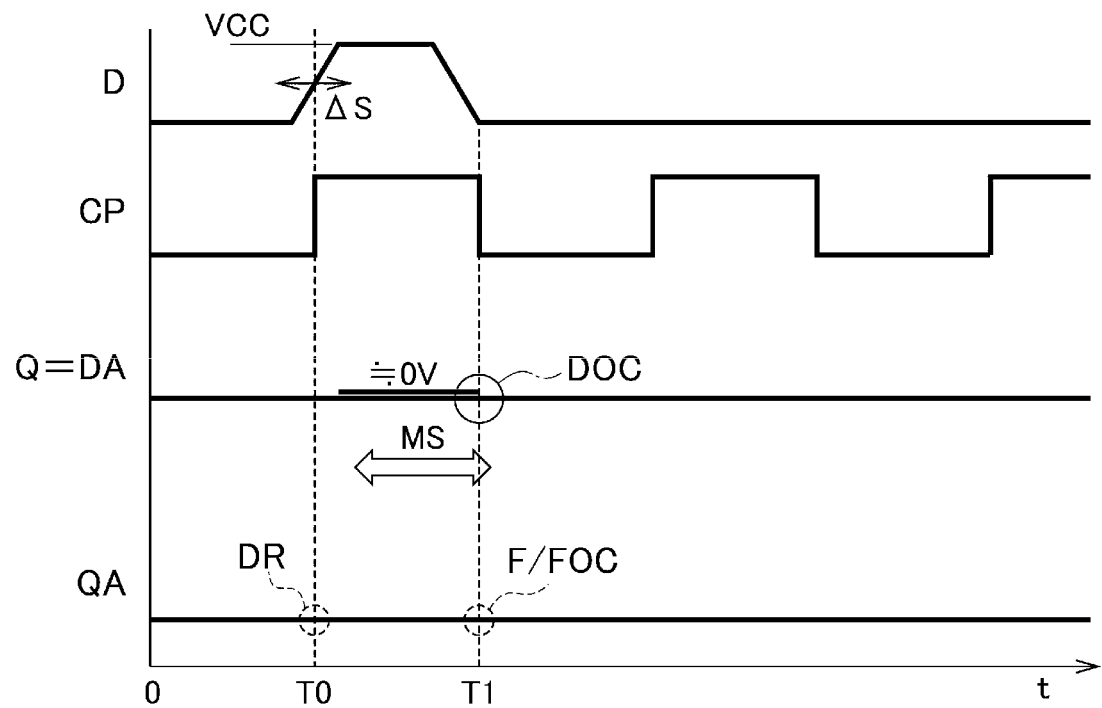
FIG. 16A is an operation timing waveform diagram of an active low-latch circuit according to a second embodiment.

FIG. 16A is an operation timing waveform diagram of the active low-latch circuit 12 according to the second embodiment. When the data input D of the non-metastable F/F circuit 1 changes asynchronously to the clock CP at time t=T0 as indicated by ΔS, a setup violation state is generated, and transfer is assumed to stop near a metastable voltage VCC/2−α. When an operation is performed in which the clock CP goes to a high level H at time t=T0 and the clock CP goes to a low level at time t=T1, the master latch ML and slave latch SL of the non-metastable F/F circuit 1 perform the same operation as that illustrated in FIG. 11A.

Regarding the data output Q of the non-metastable F/F circuit 1, the output of the non-metastable F/F circuit 1 is determined at a low level at a point represented by DOC at time t=T1.

Figure 16B:
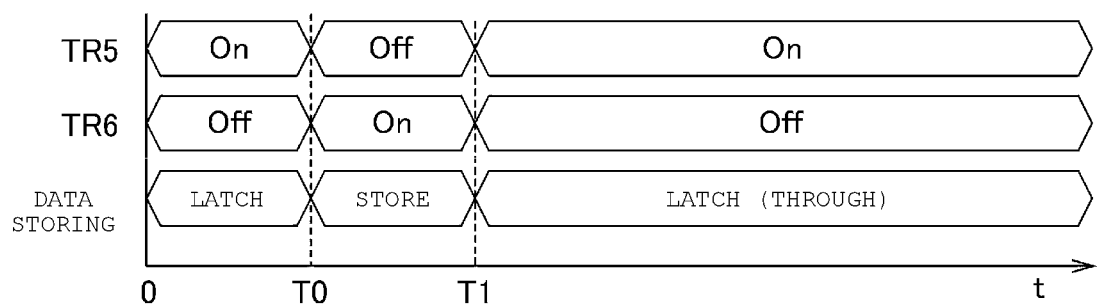
FIG. 16B is an explanatory diagram of a relationship between on/off operation timings of transfer gate circuits and data storing characteristics according to a second embodiment.

The data output QA of the active low-latch circuit 12 stores zero-level data DR at time t=T0 and continuously stores the zero-level data DR in the period from T0 to T1. Furthermore, at time t=T1, the active low-latch circuit 12 outputs zero-level data which is the same as the output DA of the non-metastable F/F circuit 1 near a point represented by F/FOC and continuously stores the zero-level data after time t=T1. FIG. 16B is an explanatory diagram of a relationship between on/off operation timings of the transfer gate circuits TR5 and TR6 and data storing characteristics according to the second embodiment.

During the period from time t=0 to T0, the clock CP is in a low level L, the transfer gate circuit TR5 enters an on state, and the transfer gate circuit TR6 enters an off state. During this period, the active low-latch circuit 12 is held in a latch state.

During the period from time t=T0 to T1, the clock CP is in a high level H, the transfer gate circuit TR5 enters an off state, and the transfer gate circuit TR6 enters an on state. During this period, data is stored in the active low-latch circuit 12.

During the period after time t=T1, the clock CP is in the low level L, the transfer gate circuit TR5 enters an on state, and the transfer gate circuit TR6 enters an off state. During this period, the active low-latch circuit 12 is held in the latch (through) state.

In the asynchronous receiving circuit 10 according to the second embodiment, as illustrated by an arrow MS, the non-metastable F/F circuit 1 determines the high level H or the low level L of data after a half cycle of the clock signal CP and does not enter a metastable state when viewed in one cycle.

Effects of Second Embodiment

In the asynchronous receiving circuit 10 according to the second embodiment, data is stored in the active low-latch circuit 12 during the period when the clock CP is in the high level H, and an output in a metastable state is not propagated to a subsequent stage.

In the asynchronous receiving circuit 10 according to the second embodiment, the combination of the non-metastable F/F circuit 1 and the active low-latch circuit 12 can prevent indefiniteness from being transmitted. Since the active low-latch circuit 12 stores an output during the period when the clock CP is in the high level H, a metastable output of the non-metastable F/F circuit 1 is not propagated at all. Since the active low-latch circuit 12 can be implemented by about half the F/F circuit, a circuit size can be reduced more than a circuit size of a general synchronization circuit composed of two F/F circuits.

The asynchronous receiving circuit 10 according to the second embodiment can prevent propagation of a metastable state regardless of a frequency of the second clock CLK2. In the first embodiment, the output Q in FIG. 11A propagates a slight metastable state to a next stage during the period between time t=T0 and time t=T1. However, in the second embodiment, the output QA of the active low-latch circuit 12 is not in the metastable state. The propagation of the metastable state is prevented because an output of the active low-latch circuit 12 is held during the period when the clock CP is in the high level H.

Third Embodiment

A flip-flop circuit according to a third embodiment is structurally similar to FIG. 9B but differs from the first embodiment in threshold voltages of respective inverters. The master latch ML of the flip-flop circuit 1 according to the third embodiment includes an inverter INV1 that has a logic threshold voltage less than or equal to one half of the power supply voltage VCC and an inverter INV2 that is connected in antiparallel to the inverter INV1 and that has a logic threshold voltage less than or equal to one half of the power supply voltage VCC (whereas the inverter INV2 of the flip-flop circuit of the first embodiment has the logic threshold voltage exceeding one half of the power supply voltage VCC). The slave latch SL of the flip-flop circuit 1 according to the third embodiment includes an inverter INV3 that is connected to the master latch ML and that has a logic threshold voltage exceeding one half of the power supply voltage VCC (whereas the inverter INV3 of the flip-flop circuit 1 of the first embodiment has the logic threshold voltage less than or equal to one half of the power supply voltage VCC) and an inverter INV4 that is connected in antiparallel to the inverter INV3 and that has a logic threshold voltage exceeding one half of the power supply voltage VCC.

In the flip-flop circuit 1 according to the third embodiment, the inverters INV1 and INV2 are set to have a low logic threshold voltage, and the inverters INV3 and INV4 is set to have a high logic threshold voltage. In order to implement these logic threshold voltages in the respective inverters in the flip-flop circuit 1 according to the third embodiment, threshold voltages of MOS transistors that configure the inverters INV, INV2, INV3, and INV4 may be set such that PMOS transistors and NMOS transistors which configure the inverters INV1 and INV3 are set to have, respectively, high threshold voltages and low threshold voltages and PMOS transistors and NMOS transistors which configure the inverters INV2 and INV4 are set to have, respectively, low threshold voltages and high threshold voltages.

Figure 17A:
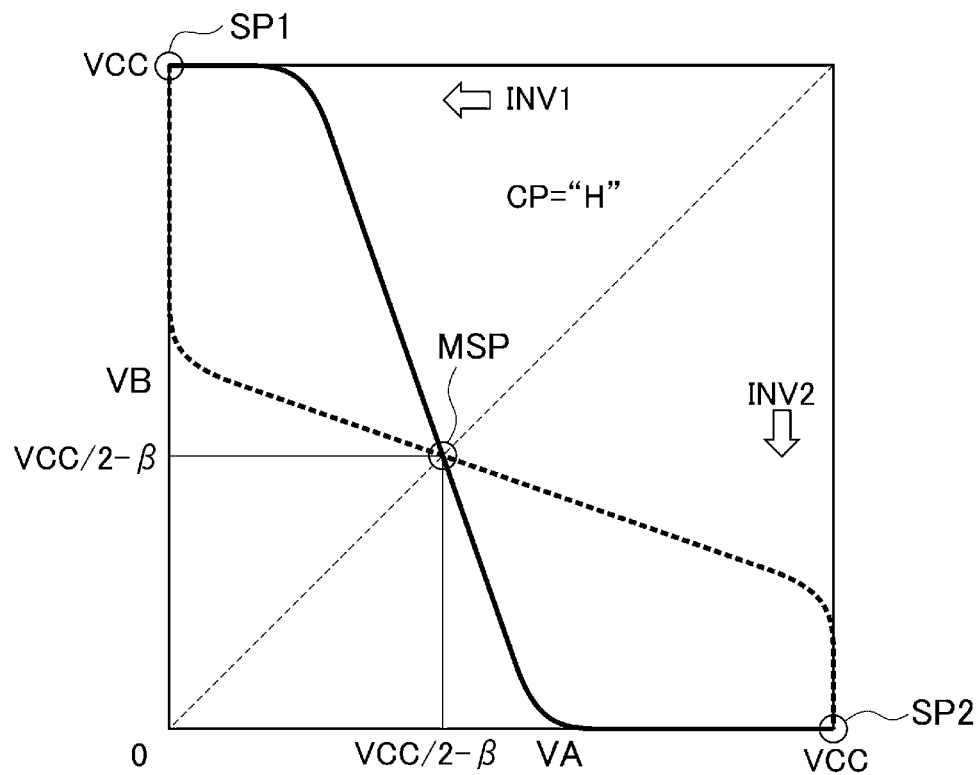
FIG. 17A depicts load characteristics of a master latch of a flip-flop circuit according to a third embodiment.
Figure 17B:
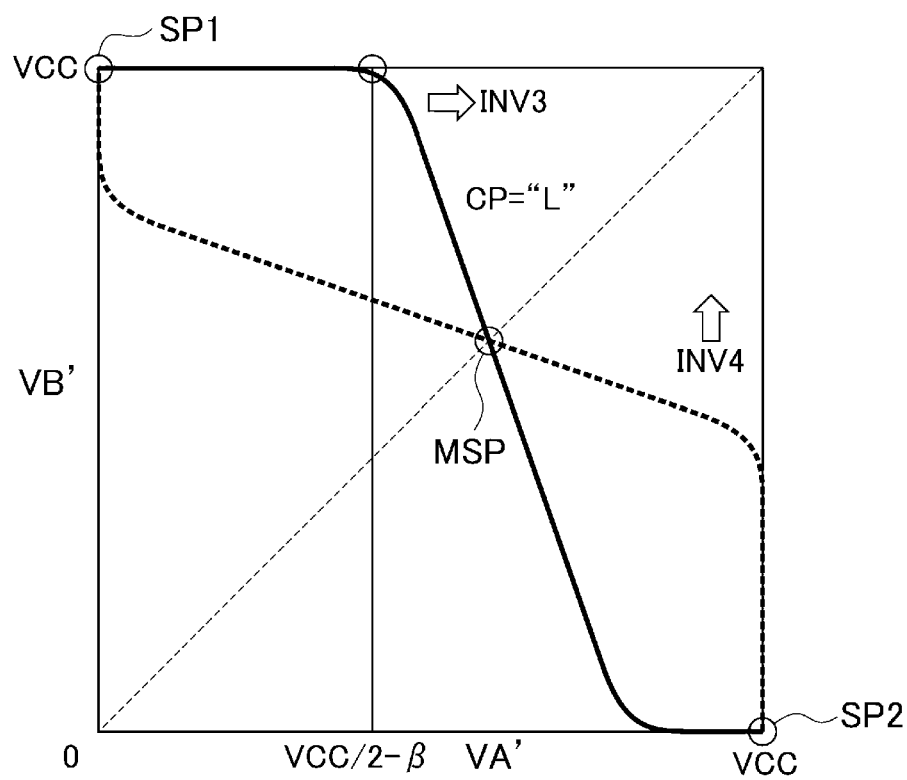
FIG. 17B depicts load characteristics of a slave latch of a flip-flop circuit according to a third embodiment.

FIG. 17A depicts load characteristics of the master latch ML of the flip-flop circuit 1 according to the third embodiment, and FIG. 17B depicts load characteristics of the slave latch SL of the flip-flop circuit 1 according to the third embodiment.

In the flip-flop circuit 1 according to the third embodiment, a metastable point MSP of the master latch ML is shifted from VA=VCC/2 and VB=VCC/2 to VA=VCC/2−β and VB=VCC/2−β, where β is a voltage in a range of 0<β<VCC/2.

In the flip-flop circuit 1 according to the third embodiment, when the data input D stops transfer near the metastable voltage VCC/2−β, an operating point of the master latch ML becomes the metastable point MSP at CP=H as illustrated in FIG. 17A, and the master latch ML enters its metastable state. At that time, the logic threshold voltages of the inverter INV1 and the inverter INV2 are low. Further, as illustrated in FIG. 17B, an operating point of the slave latch SL becomes the metastable point MSP at CP=L, and the slave latch SL enters its metastable state. At that time, the logic threshold voltages of the inverters INV3 and INV4 are high.

Operation Timing Waveform

FIG. 18 is an operation timing waveform diagram of the flip-flop circuit 1 according to the third embodiment. At time t=T0, as indicated by ΔS, when the data input D changes asynchronously to the clock CP, a setup violation state is generated and transfer is stopped near the metastable voltage VCC/2−β. When an operation is performed in which the clock CP goes to a high level H at time t=T0 and the clock CP goes to a low level at time t=T1, the master latch ML has a voltage VA of internal node increasing from a zero level to VCC/2−β and a voltage VB of internal node decreasing from VCC to VCC/2−β during the period from time T0 to time T1.

In the slave latch SL, after a slight delay from time T0, a voltage VA' of internal node is approximately equal to the voltage VB of internal node, and thus, the voltage VA' decreases from VCC to VCC/2−β. A voltage VB' of internal node increases from a zero level to a level approximately equal to VCC. A data output Q increases from the zero level to a level approximately equal to VCC.

At time t=T1 and at a point represented by DOC, the voltage VA of internal node decreases from VCC/2−β to the zero level, the voltage VB of internal node increases from VCC/2−β to VCC, and the master latch ML continuously stores values thereof. That is, the master latch ML enters an output data determination state.

Since the slave latch SL has the voltage of internal node which is VA'≈VB at time t=T1, the slave latch SL decreases from VCC/2−β to the zero level. The voltage VB' of internal node increases to VCC and holds the value thereof. The data output Q of the flip-flop circuit 1 increases to VCC and holds the value thereof.

In the flip-flop circuit 1 according to the third embodiment, a relationship between on/off operation timings of the transfer gate circuits TR1 and TR4 and the transfer gate circuits TR2 and TR3 and data storing characteristics is represented in the same manner as that of the first embodiment shown in FIG. 11B.

In the flip-flop circuit 1 according to the third embodiment, an operation when the clock CP is in a high level H is represented in the same manner as that of the first embodiment shown in FIG. 12.

In the flip-flop circuit 1 according to the third embodiment, an operation when the clock CP is in a low level L is represented in the same manner as that of the first embodiment shown in FIG. 13.

During the period from time t=0 to T0, the clock CP is in the low level L, the transfer gate circuits TR1 and TR4 enter an on state, and the transfer gate circuits TR2 and TR3 enter an off state. During this period, data is stored in the slave latch SL.

During the period from time t=T0 to time T1, the clock CP is in the high level H, the transfer gate circuits TR1 and TR4 enter an off state, and the transfer gate circuits TR2 and TR3 enter an on state. During this period, data is stored in the master latch ML.

During the period after time t=T1, the clock CP is in the low level L, the transfer gate circuits TR1 and TR4 enter an on state, and the transfer gate circuits TR2 and TR3 enter an off state. During this period, data is stored in the slave latch SL.

In the flip-flop circuit 1 according to the third embodiment, as indicated by an arrow MS in FIG. 18, the high level H or the low level L of data is determined after a half cycle of the clock CP. Determination is made when the clock falls after a half cycle. When viewed in the course of one cycle, the metastable state is resolved. That is, the metastable state ends after the half cycle.

Effects of Third Embodiment

According to the third embodiment, a metastable state can be resolved in one-half the time of a clock cycle, and a response time (latency) until an asynchronous signal is synchronized can be reduced.

Fourth Embodiment

A flip-flop circuit according to a fourth embodiment is structurally similar to FIG. 9B, but differs from the first embodiment in that a logic threshold voltage of each inverter has an opposite relationship to the logic threshold voltage in the first embodiment. The master latch ML of the flip-flop circuit 1 according to the fourth embodiment includes an inverter INV1 that has a logic threshold voltage exceeding one half of a power supply voltage VCC and an inverter INV2 that is connected in antiparallel to the inverter INV1 and that has a logic threshold voltage less than or equal to one half of the power supply voltage VCC. The slave latch SL or the flip-flop circuit 1 according to the fourth embodiment includes an inverter INV3 that is connected to the master latch ML and that has a logic threshold voltage exceeding one half of the power supply voltage VCC and an inverter INV4 that is connected in antiparallel to the inverter INV3 and that has a logic threshold voltage less than or equal to one half of the power supply voltage VCC.

In the flip-flop circuit 1 according to the fourth embodiment, the inverter INV1 is set to have a high logic threshold voltage, the inverter INV2 is set to have a low logic threshold voltage, the inverter INV3 is set to have a high logic threshold voltage, and the inverter INV4 is set to have a low logic threshold voltage. In order to implement these logic threshold voltages to the respective inverters in the flip-flop circuit 1 according to the fourth embodiment, threshold voltages of MOS transistors which configure the inverters INV, INV2, INV3, and INV4 may be set such that PMOS transistors and NMOS transistors which configure the inverters INV1 and INV3 are set to have, respectively, low threshold voltages and high threshold voltages and PMOS transistors and NMOS transistors that configure the inverters INV2 and INV4 are set to have, respectively, high threshold voltages and low threshold voltages.

Effects of Fourth Embodiment

According to the fourth embodiment, a metastable state can be resolved in one-half the time of a clock cycle, and a response time (latency) until an asynchronous signal is synchronized can be reduced.

Fifth Embodiment

A flip-flop circuit 1 according to a fifth embodiment differs from the flip-flop circuit 1 of the in FIG. 9B and also from that of the third embodiment in that a logic threshold voltage of each inverter has an opposite relationship to that in the third embodiment. The master latch ML of the flip-flop circuit 1 according to the fifth embodiment includes an inverter INV1 that has a logic threshold voltage exceeding one half of a power supply voltage VCC and an inverter INV2 that is connected in antiparallel to the inverter INV1 and that has a logic threshold voltage exceeding one half of the power supply voltage VCC (whereas both inverters INV1 and INV2 of the flip-flop circuit 1 of the third embodiment have the logic threshold voltages less than or equal to one half of the power supply voltage VCC). The slave latch SL of the flip-flop circuit 1 according to the fifth embodiment includes an inverter INV3 that is connected to the master latch ML and that has a logic threshold voltage less than or equal to one half of the power supply voltage VCC and an inverter INV4 that is connected in antiparallel to the inverter INV3 and that has a logic threshold voltage less than or equal to one half of the power supply voltage VCC (whereas both inverters INV3 and INV4 of the flip-flop circuit 1 of the third embodiment have the logic threshold voltages exceeding one half of the power supply voltage VCC).

In the flip-flop circuit 1 according to the fifth embodiment, the inverters INV1 and INV2 are set to have a high logic threshold voltage, and the inverters INV3 and INV4 are set to have a low logic threshold voltage. In order to implement these logic threshold voltages to the respective inverters, threshold voltages of MOS transistors which configure the inverters INV1, INV2, INV3, and INV4 may be set such that PMOS transistors and NMOS transistors which configure the inverters INV1 and INV2 are set to have, respectively, low threshold voltages and high threshold voltages and PMOS transistors and NMOS transistors which configure the inverters INV3 and INV4 are set to have, respectively, high threshold voltages and low threshold voltages.

Effects of Fifth Embodiment

According to the fifth embodiment, a metastable state can be resolved in one-half the time of a clock cycle, and a response time (latency) until an asynchronous signal is synchronized can be reduced.

Variation of Transistor and Variation in Inverter Characteristics

Figure 19:
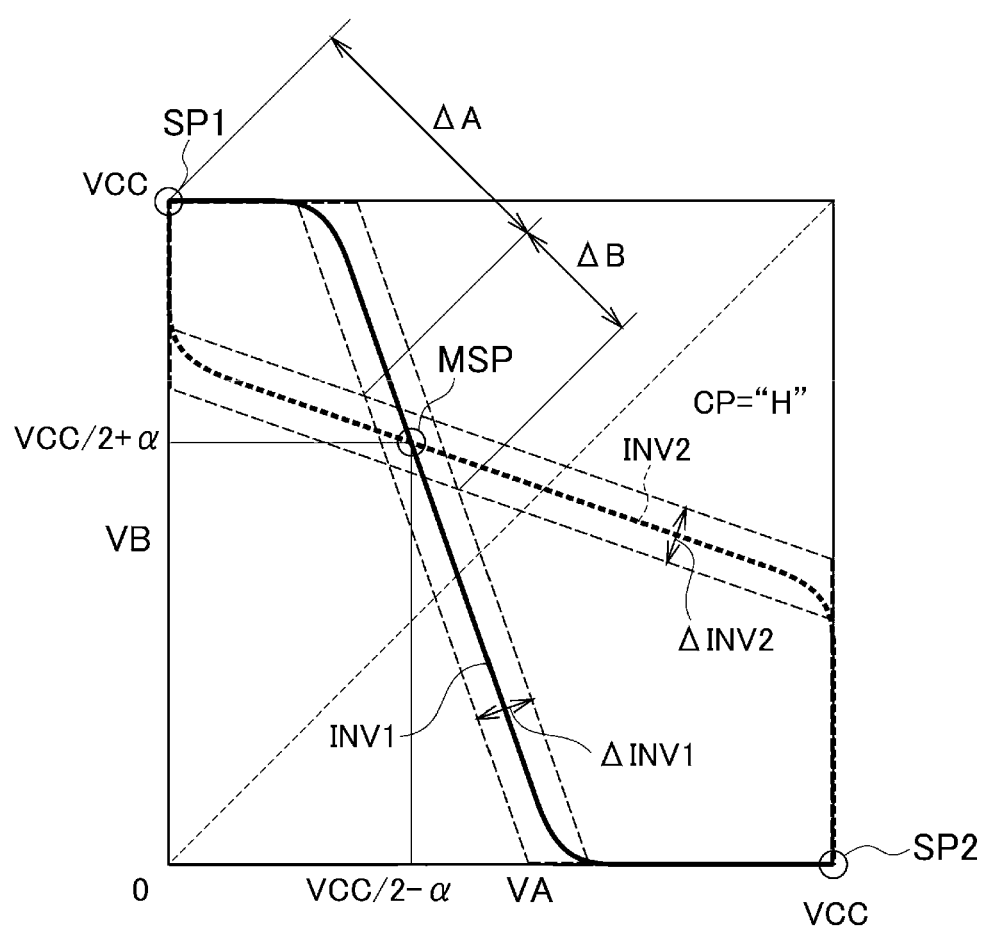
FIG. 19 depicts load characteristics of a master latch of a flip-flop circuit according to one or more embodiments.

FIG. 19 is a diagram illustrating a state in which inverter characteristics also vary due to variations of transistors in the flip-flop circuit 1. FIG. 19 uses, as one example, the load characteristic (see FIG. 10A) of the master latch ML of the flip-flop circuit 1 according to the first embodiment.

In the master latch ML, when the clock CP is in a high level H, characteristics of the inverters INV1 and INV2 also vary due to variations of actual transistors. A variation of the inverter INV1 is represented by ΔINV1, and a variation of the inverter INV2 is represented by ΔINV2. As illustrated in FIG. 2B, the inverter INV1 is configured with a CMOS transistor including the PMOSFET Qp1 and the NMOSFET Qn1, and the inverter INV2 is configured with a CMOS transistor including the PMOSFET Qp2 and the NMOSFET Qn2. Assuming that a fluctuation width of the metastable point MSP is AB and a fluctuation width between the stability point SP1 and the metastable point MSP is AA as illustrated in FIG. 19, the fluctuation width AB can be reduced and the fluctuation width AA can be increased if a variation of a transistor is reduced. If AA increases, stability of a latch can increase and an operating voltage range can increase. Further, by reducing AB, an abnormal operation during data transmission from a master latch to a slave latch can be reduced.

In order to reduce the variation of the transistor, a MOSFET with a small variation may be used. It is known that this variation amount is generally proportional to $1/\sqrt{(LW)}$ because channel dopant (impurity ion) concentration variations will be averaged over greater volumes when the channel length L and the gate width W of the MOSFET increase. A threshold voltage can be adjusted by adjusting channel impurity concentration or an oxide film thickness of a MOS transistor. Transistors with variations less than variations in threshold voltages of MOS transistors that configure transfer gate circuits may be used for the inverters INV1, INV2, INV3, and INV4.

Other Embodiments

The non-metastable F/F circuit 1 used in the asynchronous receiving circuit 10 according to the second embodiment is not limited to the same one as that of the first embodiment. The F/F circuits according to the third, fourth, and fifth embodiments may be used.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A flip-flop circuit, comprising:
a first latch comprising a first inverting logic element and a second inverting logic element, the first inverting logic element having a first logic threshold voltage, the second inverting logic element being connected in antiparallel to the first inverting logic element and having a second logic threshold voltage, the first and second logic threshold voltages being set with respect to one half of a power supply voltage; and
a second latch comprising a third inverting logic element and a fourth inverting logic element, the third inverting logic element being connected to the first latch and having a third logic threshold voltage, the fourth inverting logic element being connected in antiparallel to the third inverting logic element and having a fourth logic threshold voltage, the third and fourth logic threshold voltages being set with respect to one half of the power supply voltage.

2. The flip-flop circuit according to claim 1, wherein
the first logic threshold voltage of the first inverting logic element is less than or equal to one half of the power supply voltage,
the second logic threshold voltage of the second inverting logic element exceeds one half of the power supply voltage,
the third logic threshold voltage of the third inverting logic element is less than or equal to one half of the power supply voltage, and
the fourth logic threshold voltage of the fourth inverting logic element exceeds one half of the power supply voltage.

3. The flip-flop circuit according to claim 1, wherein
the first logic threshold voltage of the first inverting logic element is less than or equal to one half of the power supply voltage,
the second logic threshold voltage of the second inverting logic element is less than or equal to one half of the power supply voltage,
the third logic threshold voltage of the third inverting logic element exceeds one half of the power supply voltage, and
the fourth logic threshold voltage of the fourth inverting logic element exceeds one half of the power supply voltage.

4. The flip-flop circuit according to claim 1, wherein
the first logic threshold voltage of the first inverting logic element exceeds one half of a power supply voltage,
the second logic threshold voltage of the second inverting logic element is less than or equal to one half of the power supply voltage,
the third logic threshold voltage of the third inverting logic element exceeds one half of the power supply voltage, and
the fourth logic threshold voltage of the fourth inverting logic element is less than or equal to one half of the power supply voltage.

5. The flip-flop circuit according to claim 1, wherein
the first logic threshold voltage of the first inverting logic element exceeds one half of the power supply voltage,
the second logic threshold voltage of the second inverting logic element exceeds one half of the power supply voltage,
the third logic threshold voltage of the third inverting logic element is less than or equal to one half of the power supply voltage, and
the fourth logic threshold voltage of the fourth inverting logic element is less than or equal to one half of the power supply voltage.

6. The flip-flop circuit according to claim 1, further comprising:
a first transfer gate circuit connected between an input of the flip-flop circuit and an input of the first inverting logic element;
a second transfer gate circuit connected between an output of the second inverting logic element and the input of the first inverting logic element;

a third transfer gate circuit connected between an output of the first latch and an input of the third inverting logic element; and
a fourth transfer gate circuit connected between an output of the fourth inverting logic element and the input of the third inverting logic element.

7. The flip-flop circuit according to claim 6, wherein the first, second, third, and fourth transfer gate circuits each comprise a parallel circuit of an n-channel MOS transistor and a p-channel MOS transistor.

8. The flip-flop circuit according to claim 6, wherein
the first, second, third, and fourth transfer gate circuits comprise first, second, third, and fourth transistors, respectively, and
each of the first, second, third, and fourth inverting logic elements uses a transistor that has less variation than variations of the first, second, third, and fourth transistors of the first, second, third, and fourth transfer gate circuits.

9. The flip-flop circuit according to claim 1, wherein the first, second, third, and fourth inverting logic elements each comprise a complementary MOS inverter.

10. The flip-flop circuit according to claim 1, wherein
the first, second, third, and fourth inverting logic elements comprise first, second, third, and fourth MOS transistors, respectively, and
the first, second, third, and fourth logic threshold voltages of the first, second, third, and fourth inverting logic elements are adjustable by first, second, third, and fourth threshold voltages of the first, second, third, and fourth MOS transistors, respectively.

11. The flip-flop circuit according to claim 10, wherein the first, second, third, and fourth threshold voltages are adjustable by first, second, third, and fourth channel impurity concentrations or first, second, third, and fourth oxide film thicknesses of the first, second, third, and fourth MOS transistors, respectively.

12. A flip-flop circuit, comprising:
a first latch comprising a first inverting logic element and a second inverting logic element, the first inverting logic element having a first logic threshold voltage, the second inverting logic element being connected in antiparallel to the first inverting logic element and having a second logic threshold voltage; and
a second latch comprising a third inverting logic element and a fourth inverting logic element, the third inverting logic element being connected to the first latch and having a third logic threshold voltage, the fourth inverting logic element being connected in antiparallel to the third inverting logic element and having a fourth logic threshold voltage, wherein
the first, second, third, and fourth logic threshold voltages are set based on one-half of a power supply voltage, and
a metastable state of the flip-flop circuit is less than one half of a clock cycle of a clock signal supplied to the second latch circuit.

13. The flip-flop circuit according to claim 12, wherein
the first latch is a master latch,
the second latch is a slave latch, and
metastable voltages of the master latch and the slave latch are shifted by one half of the clock cycle.

14. An asynchronous receiving circuit, comprising:
a flip-flop circuit comprising:
a first latch comprising a first inverting logic element and a second inverting logic element, the first inverting logic element having a first logic threshold voltage, the second inverting logic element being connected in antiparallel to the first inverting logic element and having a second logic threshold voltage, the first and second logic threshold voltages being set with respect to one half of a power supply voltage, and
a second latch comprising a third inverting logic element and a fourth inverting logic element, the third inverting logic element being connected to the first latch and having a third logic threshold voltage, the fourth inverting logic element being connected in antiparallel to the third inverting logic element and having a fourth logic threshold voltage, the third and fourth logic threshold voltages being set with respect to one half of the power supply voltage; and
an active low-latch circuit connected to the flip-flop circuit.

15. The asynchronous receiving circuit according to claim 14, wherein
the first logic threshold voltage of the first inverting logic element is less than or equal to one half of the power supply voltage,
the second logic threshold voltage of the second inverting logic element exceeds one half of the power supply voltage,
the third logic threshold voltage of the third inverting logic element is less than or equal to one half of the power supply voltage, and
the fourth logic threshold voltage of the fourth inverting logic element exceeds one half of the power supply voltage.

16. The asynchronous receiving circuit according to claim 14, wherein
the first logic threshold voltage of the first inverting logic element is less than or equal to one half of the power supply voltage,
the second logic threshold voltage of the second inverting logic element is less than or equal to one half of the power supply voltage,
the third logic threshold voltage of the third inverting logic element exceeds one half of the power supply voltage, and
the fourth logic threshold voltage of the fourth inverting logic element exceeds one half of the power supply voltage.

17. The asynchronous receiving circuit according to claim 14, wherein
the first logic threshold voltage of the first inverting logic element exceeds one half of a power supply voltage,
the second logic threshold voltage of the second inverting logic element is less than or equal to one half of the power supply voltage,
the third logic threshold voltage of the third inverting logic element exceeds one half of the power supply voltage, and
the fourth logic threshold voltage of the fourth inverting logic element is less than or equal to one half of the power supply voltage.

18. The asynchronous receiving circuit according to claim 14, wherein
the first logic threshold voltage of the first inverting logic element exceeds one half of the power supply voltage,
the second logic threshold voltage of the second inverting logic element exceeds one half of the power supply voltage, the third logic threshold voltage of the third inverting logic element is less than or equal to one half of the power supply voltage, and the fourth logic threshold voltage of the fourth inverting logic element is less than or equal to one half of the power supply voltage.

19. The asynchronous receiving circuit according to claim 14, wherein the active low-latch circuit comprises a third latch including:

a fifth inverting logic element;

a sixth inverting logic element connected in antiparallel to the fifth inverting logic element; and a seventh inverting logic element connected to an output of the third latch.

20. The asynchronous receiving circuit according to claim 19, further comprising:

a fifth transfer gate circuit connected between an input of the active low-latch circuit and an input of the fifth inverting logic element; and a sixth transfer gate circuit connected between an output of the sixth inverting logic element and the input of the fifth inverting logic element.

* * * * *